(12) United States Patent
Noh et al.

(10) Patent No.: US 11,929,366 B2
(45) Date of Patent: Mar. 12, 2024

(54) SEMICONDUCTOR DEVICE

(71) Applicant: SAMSUNG ELECTRONICS CO., LTD., Suwon-si (KR)

(72) Inventors: Sunyoung Noh, Hwaseong-si (KR); Wandon Kim, Seongnam-si (KR); Hyunbae Lee, Seoul (KR); Donggon Yoo, Suwon-si (KR); Dong-Chan Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 55 days.

(21) Appl. No.: 17/846,177

(22) Filed: Jun. 22, 2022

(65) Prior Publication Data
US 2022/0352156 A1 Nov. 3, 2022

Related U.S. Application Data

(63) Continuation of application No. 16/851,476, filed on Apr. 17, 2020, now Pat. No. 11,374,001.

(30) Foreign Application Priority Data

Sep. 3, 2019 (KR) ......................... 10-2019-0109083

(51) Int. Cl.
*H01L 27/088* (2006.01)
*H01L 21/321* (2006.01)
(Continued)

(52) U.S. Cl.
CPC ...... *H01L 27/0886* (2013.01); *H01L 21/3212* (2013.01); *H01L 21/76802* (2013.01);
(Continued)

(58) Field of Classification Search
CPC ............ H01L 27/0886; H01L 21/3212; H01L 21/76802; H01L 21/7684; H01L 21/76843; H01L 21/7685; H01L 21/823475; H01L 23/5283; H01L 23/53238; H01L 23/53252; H01L 23/53266; H01L 23/535; H01L 29/0673; H01L 21/76877; H01L 29/0653;
(Continued)

(56) References Cited

U.S. PATENT DOCUMENTS 8,736,055 B2   5/2014 Kolics et al.
8,907,483 B2  12/2014 Zhao et al.
(Continued)

FOREIGN PATENT DOCUMENTS

JP    2014-183207 A    9/2014

*Primary Examiner* — Farun Lu
(74) *Attorney, Agent, or Firm* — Fish & Richardson P.C.

(57) ABSTRACT

A semiconductor device includes an interlayer dielectric layer on a substrate, a first connection line that fills a first trench of the interlayer dielectric layer, the first trench having a first width, and a second connection line that fills a second trench of the interlayer dielectric layer, the second trench having a second width greater than the first width, and the second connection line including a first metal layer that covers an inner sidewall of the second trench, a barrier layer that covers a bottom surface of the second trench, and a second metal layer on the first metal layer and the barrier layer, the first connection line and the first metal layer include a first metal, and the second metal layer includes a second metal different from the first metal.

19 Claims, 28 Drawing Sheets

(51) Int. Cl.
*H01L 21/768* (2006.01)
*H01L 21/8234* (2006.01)
*H01L 23/528* (2006.01)
*H01L 23/532* (2006.01)
*H01L 23/535* (2006.01)
*H01L 29/06* (2006.01)

(52) U.S. Cl.
CPC .... *H01L 21/7684* (2013.01); *H01L 21/76843* (2013.01); *H01L 21/7685* (2013.01); *H01L 21/823475* (2013.01); *H01L 23/5283* (2013.01); *H01L 23/53238* (2013.01); *H01L 23/53252* (2013.01); *H01L 23/53266* (2013.01); *H01L 23/535* (2013.01); *H01L 29/0673* (2013.01)

(58) Field of Classification Search
CPC ........... H01L 21/823821; H01L 23/485; H01L 29/41791; H01L 21/76831; H01L 21/76844; H01L 23/5286; H01L 23/53242; H01L 29/0847; H01L 29/42376; H01L 29/775; H01L 29/78; H01L 21/76895; H01L 29/66477; H01L 29/4236; H01L 21/02172; H01L 21/02263; H01L 21/28008; H01L 21/304; H01L 29/41725; H01L 29/7846; H01L 29/7848; H01L 2924/01029; H01L 2924/01044; B82Y 10/00
See application file for complete search history.

(56) References Cited

U.S. PATENT DOCUMENTS

| | | | |
|---|---|---|---|
| 9,142,505 | B2 | 9/2015 | Yang et al. |
| 9,613,907 | B2 | 4/2017 | Hegde et al. |
| 10,037,913 | B2 | 7/2018 | Yang |
| 10,049,980 | B1 | 8/2018 | Adusumilli et al. |
| 2003/0013297 | A1 | 1/2003 | Chen et al. |
| 2004/0056366 | A1* | 3/2004 | Maiz ................ H01L 21/76825 257/E21.295 |
| 2004/0175926 | A1 | 9/2004 | Wang et al. |
| 2013/0234341 | A1 | 9/2013 | Onai |
| 2018/0083007 | A1* | 3/2018 | Lee ...................... H01L 27/092 |
| 2018/0277426 | A1 | 9/2018 | Xie et al. |
| 2018/0308752 | A1 | 10/2018 | Zhang et al. |
| 2018/0350665 | A1* | 12/2018 | Chae ................ H01L 23/5283 |
| 2020/0058651 | A1* | 2/2020 | Liaw ................ H01L 29/7851 |

* cited by examiner

SEMICONDUCTOR DEVICE

CROSS-REFERENCE TO RELATED APPLICATION

This application is a continuation of U.S. patent application Ser. No. 16/851,476 filed Apr. 17, 2020, which is incorporated by reference herein in its entirety.

Korean Patent Application No. 10-2019-0109083, filed on Sep. 3, 2019, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device including a field effect transistor and a method of fabricating the same.

2. Description of the Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices have been gradually complicated and integrated to meet these requested characteristics.

SUMMARY

According to some example embodiments, a semiconductor device may include an interlayer dielectric layer on a substrate, a first connection line that fills a first trench of the interlayer dielectric layer, the first trench having a first width, and a second connection line that fills a second trench of the interlayer dielectric layer. The second trench may have a second width greater than the first width. The second connection line may include a first metal layer that covers an inner sidewall of the second trench, a barrier layer that covers a bottom surface of the second trench; and a second metal layer on the first metal layer and the barrier layer. The first connection line and the first metal layer may include a first metal. The second metal layer may include a second metal different from the first metal.

According to some example embodiments, a semiconductor device may include a substrate that includes a first active region, a first active pattern on the first active region, a first source/drain pattern on an upper portion of the first active pattern, a gate electrode that runs across the first active pattern, an interlayer dielectric layer that covers the first source/drain pattern and the gate electrode, and a first connection line and a second connection line in the interlayer dielectric layer. The first connection line may have a first width. The second connection line may have a second width greater than the first width. The second connection line may include a first metal layer on an inner sidewall of a trench of the interlayer dielectric layer, a barrier layer on a bottom surface of the trench of the interlayer dielectric layer, and a second metal layer on the first metal layer and the barrier layer. The first connection line and the first metal layer may include a first metal. The second metal layer may include a second metal different from the first metal.

According to some example embodiments, a semiconductor device may include a logic cell on a substrate, the logic cell including a first active region and a second active region that are spaced apart from each other in a first direction, a first active pattern and a second active pattern respectively on the first active region and the second active region, the first and second active patterns extending in a second direction that intersects the first direction, a first source/drain pattern and a second source/drain pattern respectively on an upper portion of the first active pattern and an upper portion of the second active pattern, a plurality of gate electrodes that extend in the first direction and run across the first and second active patterns, the gate electrodes being arranged in the second direction; an interlayer dielectric layer that covers the gate electrodes and the first and second source/drain patterns, and a first connection line and a second connection line in the interlayer dielectric layer. The first connection line may be electrically connected to one or more of the first and second source/drain patterns and the gate electrodes. The second connection line may be electrically connected to one or more of the first and second source/drain patterns. The first and second connection lines may extend parallel to each other in the second direction. The first connection line may have a first width. The second connection line may have a second width greater than the first width. The second connection line may include a first metal layer on an inner sidewall of a trench of the interlayer dielectric layer, a barrier layer on a bottom surface of the trench of the interlayer dielectric layer, and a second metal layer on the first metal layer and the barrier layer. The first connection line and the first metal layer may include ruthenium (Ru). The second metal layer may include copper (Cu).

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
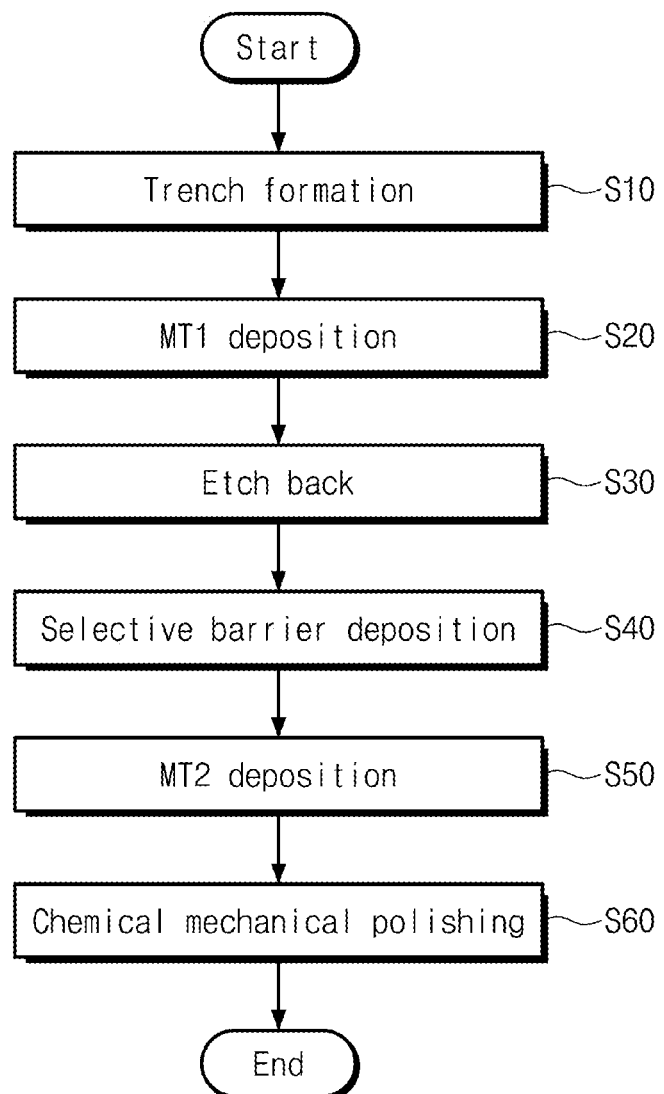
FIG. 1 illustrates a flow chart of a method of fabricating a semiconductor device according to some example embodiments.

FIG. 1 illustrates a flow chart showing a method of fabricating a semiconductor device according to some example embodiments. FIGS. 2A to 2F illustrate cross-sectional views of stages a method of fabricating a semiconductor device according to some example embodiments.

Figure 2A:
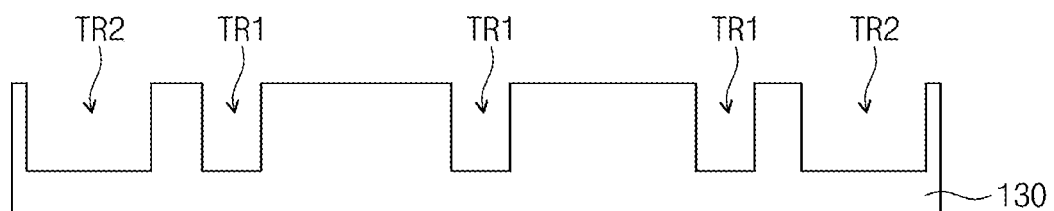
FIGS. 2A to 2F illustrate cross-sectional views of stages in a method of fabricating a semiconductor device according to some example embodiments.

Referring to FIGS. 1 and 2A, an interlayer dielectric layer 130 may be provided on a substrate. The substrate may be a compound semiconductor substrate or a semiconductor substrate including, e.g., silicon, germanium, silicon-germanium, or the like. For example, the substrate may be a silicon substrate. The interlayer dielectric layer 130 may include tetraethoxysilane (TEOS), low-k dielectric, or the like.

A trench may for forming a connection line may be formed on the interlayer dielectric layer 130 (S10). For example, on the interlayer dielectric layer 130, a first trench TR1 may be formed to have a first width and a second trench TR2 may be formed to have a second width greater than the first width.

Figure 2B:
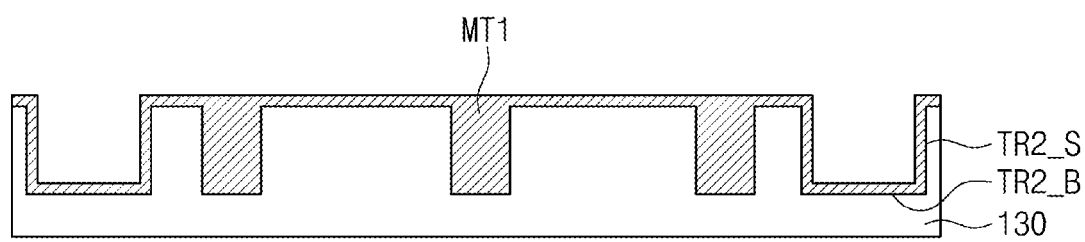

Referring to FIGS. 1 and 2B, a first metal MT1 may be deposited on the interlayer dielectric layer 130 (S20). The first metal MT1 may be deposited by one of, e.g., physical vapor deposition (PVD), chemical vapor deposition (CVD), and atomic layer deposition (ALD).

The first metal MT1 may completely fill the first trench TR1, e.g., due to smaller width, and may partially fill the second trench TR2. For example, the first metal MT1 may cover an inner sidewall TR2_S and a bottom surface TR2_B of the second trench TR2, e.g., the first metal MT1 may be formed conformally on inner surfaces of the second trench TR2.

The first metal MT1 may include at least one of, e.g., cobalt (Co), ruthenium (Ru), rhodium (Rh), iridium (Ir), and molybdenum (Mo). For example, the first metal MT1 may include ruthenium (Ru).

Figure 2C:
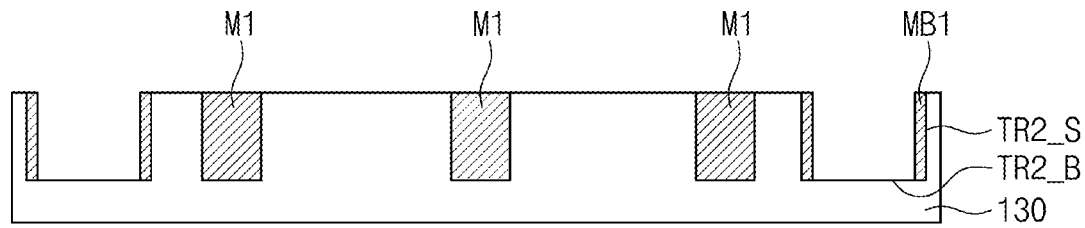

Referring to FIGS. 1 and 2C, a portion of the first metal MT1 formed on the interlayer dielectric layer 130 may be removed (S30). The portion of the first metal MT1 may be removed by an etching process, e.g., an etch-back process.

The etching process may remove the first metal MT1 that covers the topmost surface of the interlayer dielectric layer 130 and the bottom surface TR2_B of the second trench TR2. The first metal MT1 covering the inner sidewall TR2_S of the second trench TR2 may remain as a first metal layer MB1.

The first metal MT1 filling the first trench TR1 may remain inside the first trench TR1. As shown in FIG. 2C, the first metal MT1 may completely fill the first trench TR1, thereby forming a first connection line M1. For example, the first connection line M1 may have an aspect ratio, e.g., a ratio of the depth to its width, of about 1.5 to about 3.5.

Figure 2D:
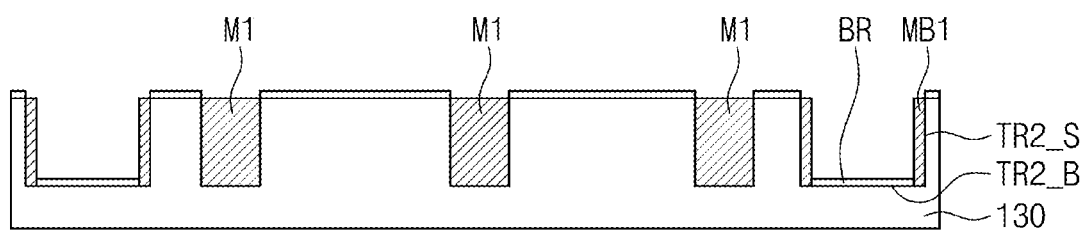

Referring to FIGS. 1 and 2D, a barrier layer BR may be selectively deposited on a portion of the interlayer dielectric layer 130 (S40). The barrier layer BR may cover a top surface of the interlayer dielectric layer 130 and the bottom surface TR2_B of the second trench TR2, e.g., the barrier layer BR may be formed directly only on exposed surfaces of the interlayer dielectric layer 130 to maintain the first connection line M1 exposed.

The barrier layer BR may be a self-assembled monolayer (SAM) and may include at least one of, e.g., hafnium nitride (HfN), tungsten nitride (WN), tungsten carbonitride (WCN), hafnium oxide (HfO), and tungsten oxide (WO). For example, the barrier layer BR may be deposited by, e.g., physical vapor deposition (PVD), chemical vapor deposition (CVD), and atomic layer deposition (ALD).

Figure 2E:
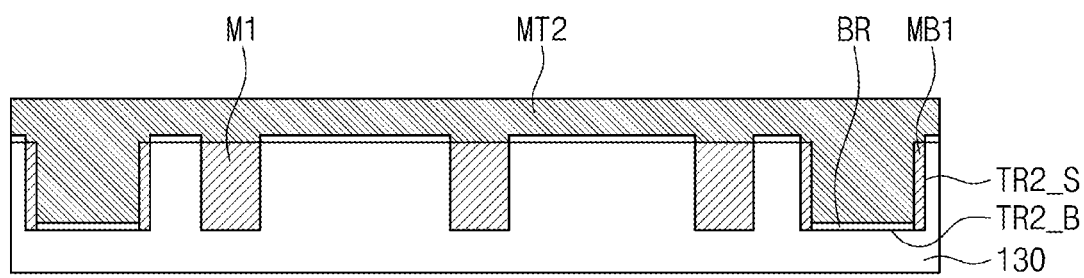

Referring to FIGS. 1 and 2E, a second metal MT2 may be deposited on the interlayer dielectric layer 130 (S50). For example, as illustrated in FIG. 2E, the second metal MT2 may cover exposed surfaces of the barrier layer BR and the first connection line M1, e.g., the second metal MT2 may completely fill the second trench TR2. The second metal MT2 may be formed by, e.g., physical vapor deposition (PVD), chemical vapor deposition (CVD), and electroplating (EP).

The second metal MT2 may be different from the first metal MT1, and may include at least one of, e.g., copper (Cu), ruthenium (Ru), molybdenum (Mo), platinum (Pt), iridium (Ir), rhodium (Rh), and titanium nitride (TiN). For example, the second metal MT2 may include copper (Cu).

Figure 2F:
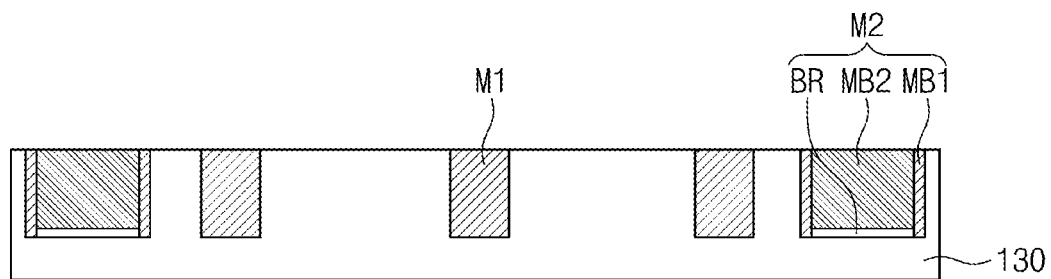

Referring to FIGS. 1 and 2F, a portion of the second metal MT2 deposited on the interlayer dielectric layer 130 may be removed (S60). The portion of the second metal MT2 may be removed by a planarization process, e.g., chemical mechanical polishing (CMP). For example, as illustrated in FIG. 2F, the second metal MT2 may be planarized to have its top surface coplanar with that of the first connection lines M1.

The second metal MT2 may be deposited in the second trench TR2 to contact portions of the first metal layer MB1 (on sidewalls of the second trench TR2) and a portion of the barrier layer BR (on the bottom of the second trench TR2), thereby forming a second metal layer MB2 in the second trench TR2. A second connection line M2 may be constituted by the second metal layer MB2 together with the first metal layer MB1 and the barrier layer BR in the second trench TR2. For example, as illustrated in FIG. 2F, the second connection line M2 may have a smaller aspect ratio than the first connection line M1, e.g., the second connection line M2 may have an aspect ratio of about 0.5 to about 1.5.

Figure 3:
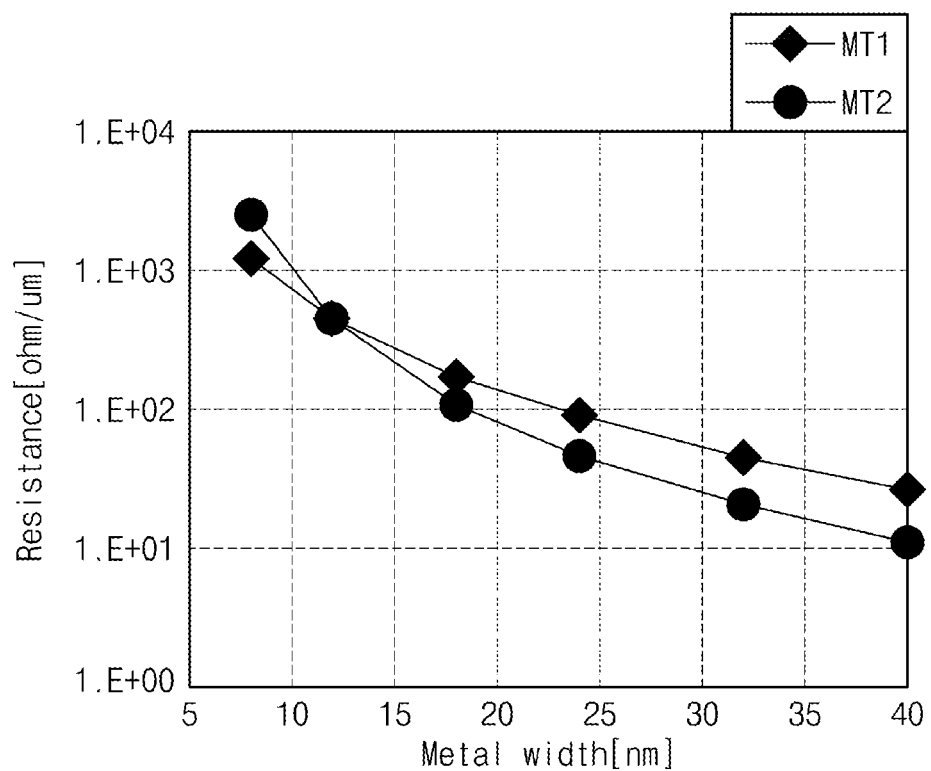
FIG. 3 illustrates a graph of a relationship between width and resistance of metallic materials included in a semiconductor device according to some example embodiments.

FIG. 3 illustrates a graph showing a relationship between width and resistance of metallic materials included in a semiconductor device according to some example embodiments.

Referring to FIG. 3, the second metal MT2 may rapidly increase in resistance at or below a certain width thereof. Accordingly, at or below the certain width, the first metal MT1 may have a resistance less than that of the second metal MT2. For example, at the first width (i.e., the first point on the graph in FIG. 3), the resistance of the first metal MT1 may be less than that of the second metal MT2, and at the second width (i.e., the third point on the graph in FIG. 3), the resistance of the second metal MT2 may be less than that of the first metal MT1.

Referring back to FIG. 2F, the first metal MT1 may fill the first trench TR1 having the first width (e.g., from the graph of FIG. 3), and the second metal MT2 may fill the second trench TR2 having the second width (from the graph of FIG. 3). The second trench TR2 may be filled with the first metal layer MB1 including the first metal MT1 and with the second metal layer MB2 including the second metal MT2. In other words, the second trench TR2 may include a hybrid connection line including both the first metal MT1 and the second metal MT2, e.g., a hybrid Ru/Cu connection line including a minimized amount of ruthenium (e.g., to minimize costs and eliminate a separate CMP process of ruthenium) that surrounds a copper line, to improve costs and resistance of a connection line. Accordingly, because a semiconductor device according to embodiments includes the first metal MT1 and the second metal MT2 having their resistance that is different depending on their width, the semiconductor device may decrease in resistance and increase in operating speed.

Figure 4:
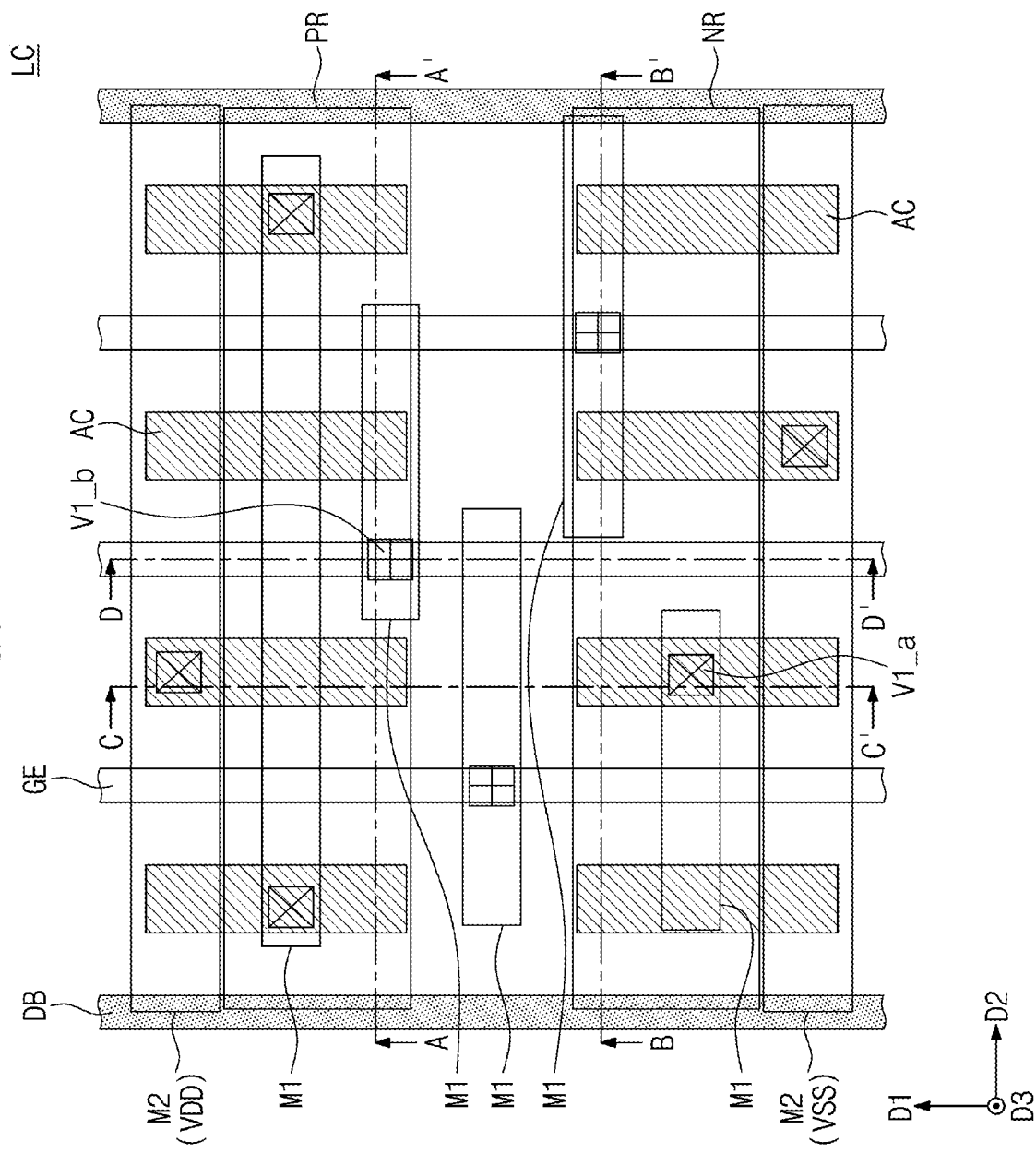
FIG. 4 illustrates a plan view of a semiconductor device according to some example embodiments.

FIG. 4 illustrates a plan view showing a semiconductor device according to some example embodiments. FIGS. 5A, 5B, 5C, and 5D illustrate cross-sectional views respectively taken along lines A-A', B-B', C-C', and D-D' of FIG. 4.

Referring to FIGS. 4 and 5A to 5D, a logic cell LC may be provided on a substrate 100. The logic cell LC may be provided thereon with logic transistors that constitute a logic circuit.

The substrate 100 may include a first active region PR and a second active region NR. In an embodiment, the first active region PR may be a PMOSFET area, and the second active region NR may be an NMOSFET area.

Figure 5A:
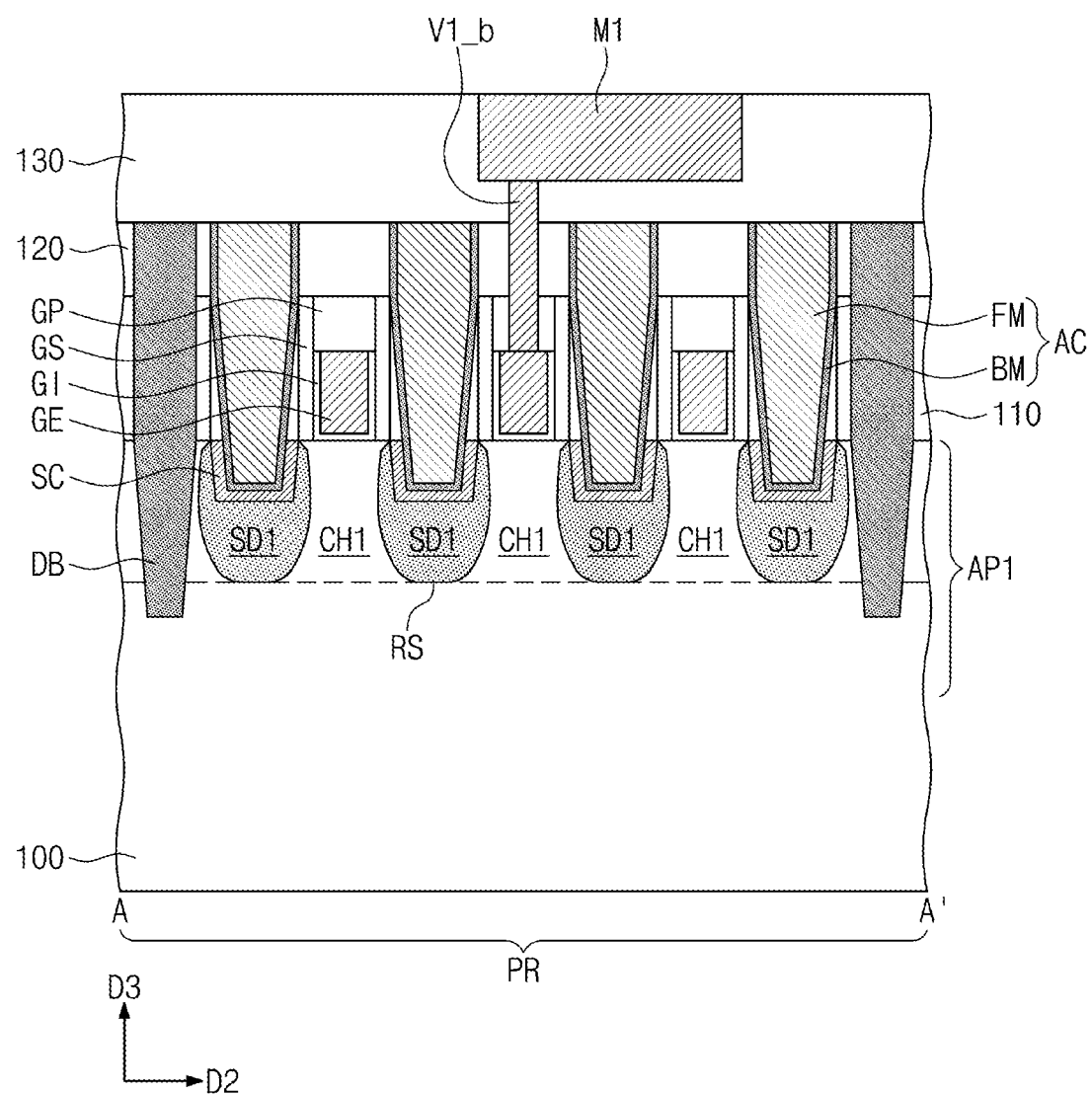
FIGS. 5A, 5B, 5C, and 5D illustrate cross-sectional views respectively taken along lines A-A', B-B', C-C', and D-D' of FIG. 4.
Figure 5B:
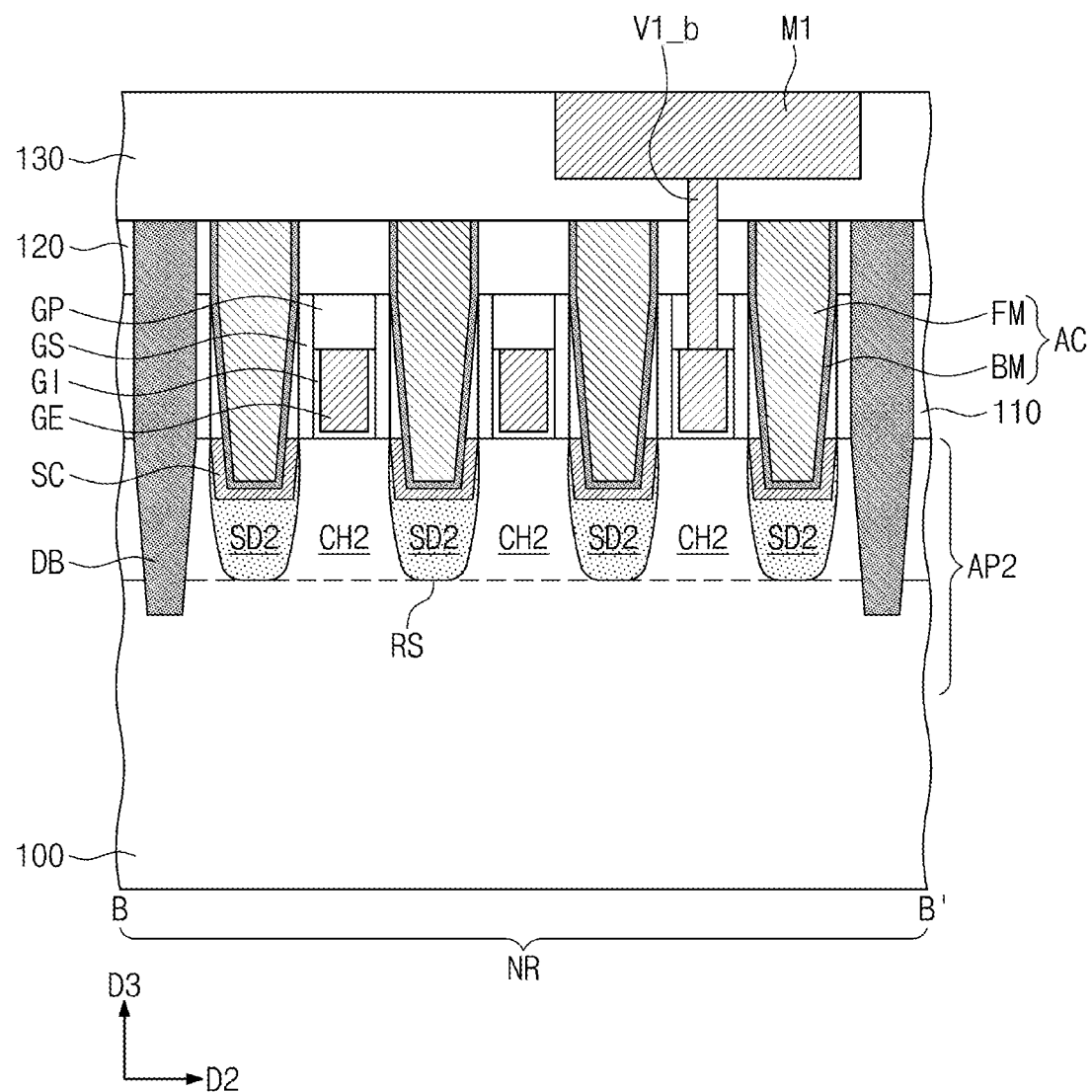
Figure 5C:
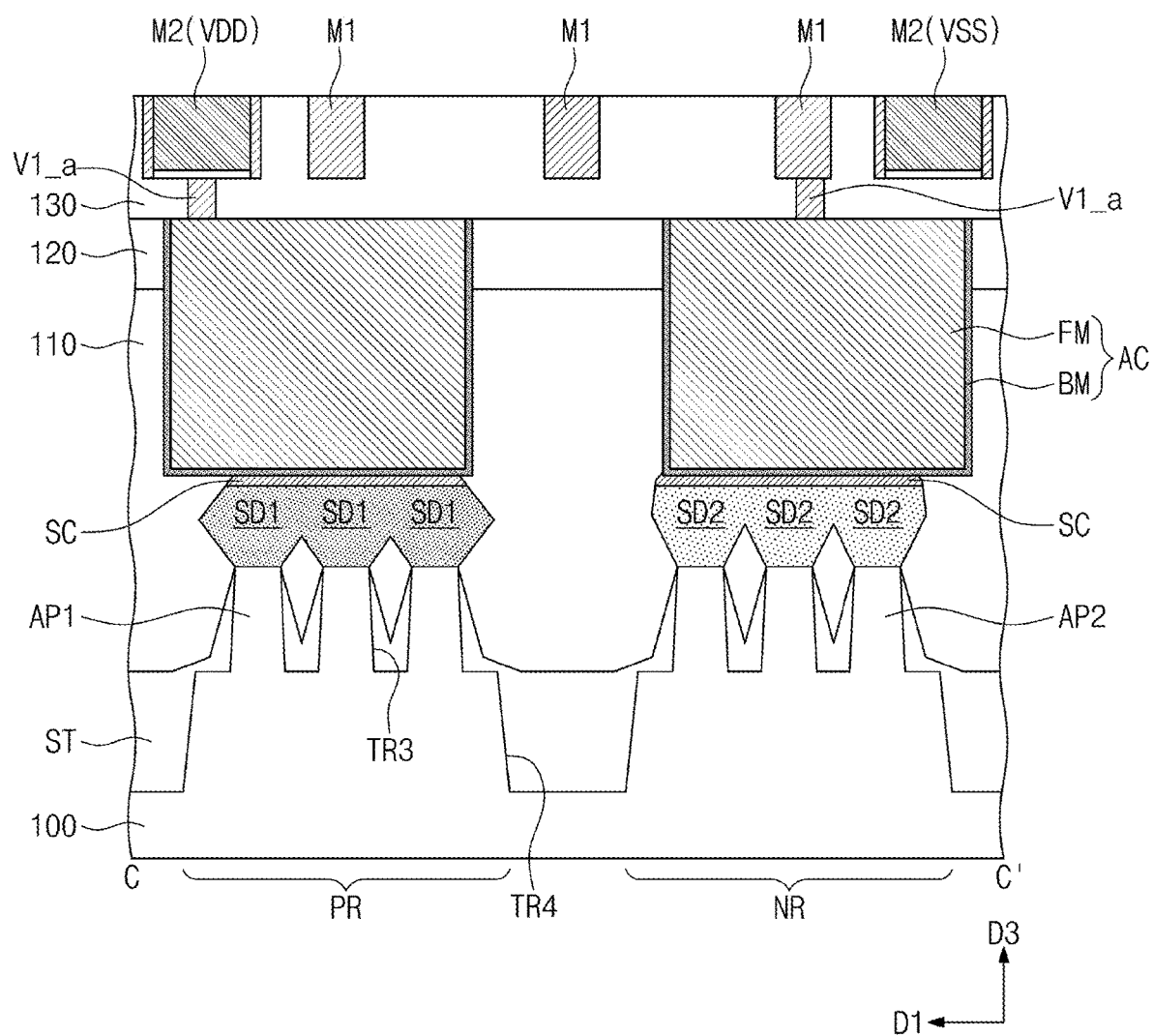
Figure 5D:
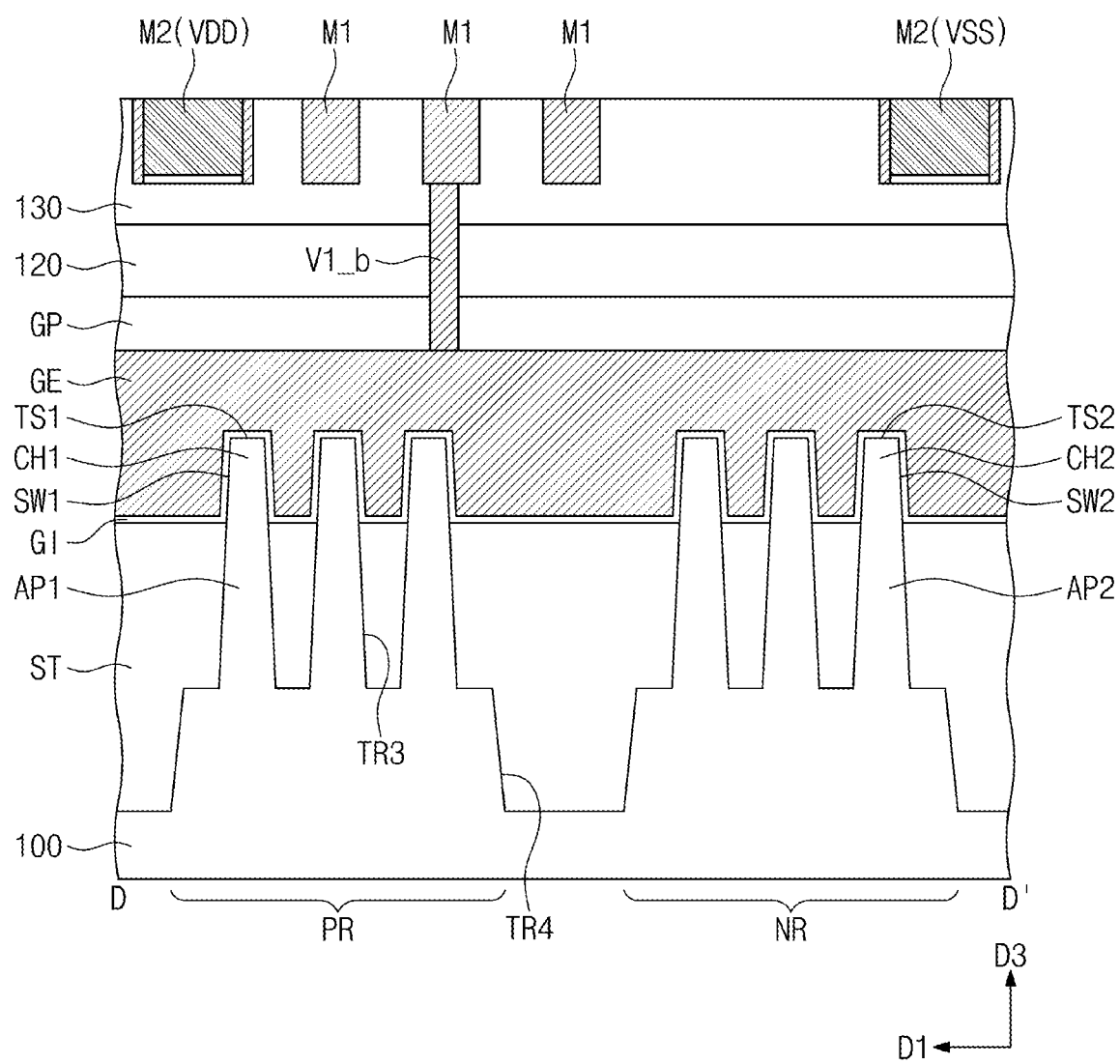

The first active region PR and the second active region NR may be defined by a fourth trench TR4 formed on an upper portion of the substrate 100 (FIGS. 5C and 5D). The fourth trench TR4 may be positioned between the first and second active regions PR and NR. The first and second active regions PR and NR may be spaced apart from each other in a first direction D1 across the fourth trench TR4. Each of the first and second active regions PR and NR may extend in a second direction D2 intersecting the first direction D1.

First active patterns AP1 and second active patterns AP2 may be respectively provided on the first active region PR and the second active region NR. The first and second active patterns AP1 and AP2 may extend parallel to each other in the second direction D2. The first and second active patterns AP1 and AP2 may be vertically protruding portions of the substrate 100. A third trench TR3 may be defined between neighboring first active patterns AP1 and between neighboring second active patterns AP2. The third trench TR3 may be shallower than the fourth trench TR4.

A device isolation layer ST may fill the third and fourth trenches TR3 and TR4. The device isolation layer ST may include, e.g., a silicon oxide layer. The first and second active patterns AP1 and AP2 may have their upper portions that protrude vertically upwards from the device isolation layer ST (see FIG. 5D). Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their topmost surfaces coplanar with those of the first and second channel patterns CH1 and CH2 (FIGS. 5A and 5B). In another example, the first and second source/drain patterns SD1 and SD2 may have their topmost surfaces higher than those of the first and second channel patterns CH1 and CH2.

The first source/drain patterns SD1 may include a semiconductor element (e.g., SiGe) having a lattice constant that is greater than that of a semiconductor element of the substrate 100. The first source/drain patterns SD1 may therefore provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged along the second direction D2. The gate electrodes GE may vertically overlap the first and second channel patterns CH1 and CH2 (FIGS. 5A and 5B). Each of the gate electrodes GE may surround the top surface and opposite sidewalls of each of the first and second channel patterns CH1 and CH2 (FIG. 5D).

Referring back to FIG. 5D, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and at least one second sidewall SW2 of the second channel pattern CH2. In this sense, a transistor according to the present embodiment may be a three-dimensional field effect transistor (e.g., FinFET) in which the first and second channel patterns CH1 and CH2 are three-dimensionally surrounded by the gate electrode GE.

Referring back to FIGS. 4 and 5A to 5D, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. For example, the gate spacers GS may include one or more of SiCN, SiCON, and SiN. In another example, the gate spacers GS may include a multi-layer including two or more of SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST below the gate electrode GE (see FIG. 5D).

In an embodiment, the gate dielectric pattern GI may include a high-k dielectric material having a dielectric constant that is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gated dielectric pattern GI and adjacent to the first and second channel patterns CH1 and CH2. The first metal pattern may include a work function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal, e.g., at least one of titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include metal having a resistance that is lower than that of the first metal pattern. For example, the second metal pattern may include one or more of tungsten (W), aluminum (Al), titanium (Ti), and tantalum (Ta).

The first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 covering the gate capping patterns GP. The interlayer dielectric layer 130, i.e., a third interlayer dielectric layer 130, may be provided on the second interlayer dielectric layer 120, e.g., the second interlayer dielectric layer 120 may be between the first and third interlayer dielectric layers 110 and 130.

The logic cell LC may be provided on its opposite sides with a pair of separation structures DB that face each other, e.g., spaced apart from each other, in the second direction D2. The separation structures DB may extend in the first direction D1 parallel to the gate electrodes GE.

The separation structure DB may penetrate the first and second interlayer dielectric layers 110 and 120 and may extend into the first and second active patterns AP1 and AP2 (FIGS. 5A and 5B). The separation structure DB may penetrate a corresponding one of the upper portions of the first and second active patterns AP1 and AP2. The separation structure DB may separate the first and second active regions PR and NR of the logic cell LC from an active region of an adjacent logic cell.

Active contacts AC may be provided to penetrate the first and second interlayer dielectric layers 110 and 120 and to have electrical connection with the first and second source/drain patterns SD1 and SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. For example, as illustrated in FIGS. 5A and 5B, the active contact AC may cover at least a portion of a sidewall of the gate spacer GS. In another example, the active contact AC may partially cover a top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, e.g., one or more of titanium silicide, tantalum silicide, tungsten silicide, nickel silicide, and cobalt silicide.

The active contact AC may include a conductive pattern FM and a barrier pattern BM surrounding the conductive pattern FM. For example, the conductive pattern FM may include one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of titanium nitride (TiN), tantalum nitride (TaN), tungsten nitride (WN), nickel nitride (NiN), cobalt nitride (CoN), and platinum nitride (PtN).

First connection lines M1 and second connection lines M2 may be provided in the third interlayer dielectric layer 130. A detailed description of the first and second connection lines M1 and M2 is substantially the same as that discussed above with reference to FIGS. 2A to 2F.

The first and second connection lines M1 and M2 may extend in the second direction D2, e.g., perpendicularly to the gate electrodes GE (FIG. 4). A cell boundary may be defined to extend in the second direction D2 on opposite sides of the logic cell LC, and the second connection lines M2 may be disposed on the cell boundary. The first connection lines M1 may be disposed between the second connection lines M2 and may be spaced apart in the first direction D1 from each other at a regular interval.

First and second lower vias V1_a and V1_b may be provided below the first and second connection lines M1 and M2. The first lower vias V1_a may be correspondingly interposed between the active contacts AC and the first and second connection lines M1 and M2 (squares with "X" on top that overlap the active contacts AC in FIG. 4), while electrically connecting the active contacts AC to the first and second connection lines M1 and M2. The second lower vias V1_b may be correspondingly interposed between the gate electrodes GE and the first and second connection lines M1 and M2 (squares with "+" on top that overlap the gate electrodes GE in FIG. 4), while electrically connecting the gate electrodes GE to the first and second connection lines M1 and M2. A damascene or dual damascene process may be performed to form the first and second connection lines M1 and M2 together with either the first lower vias V1_a or the second lower vias V1_b.

Figure 9A:
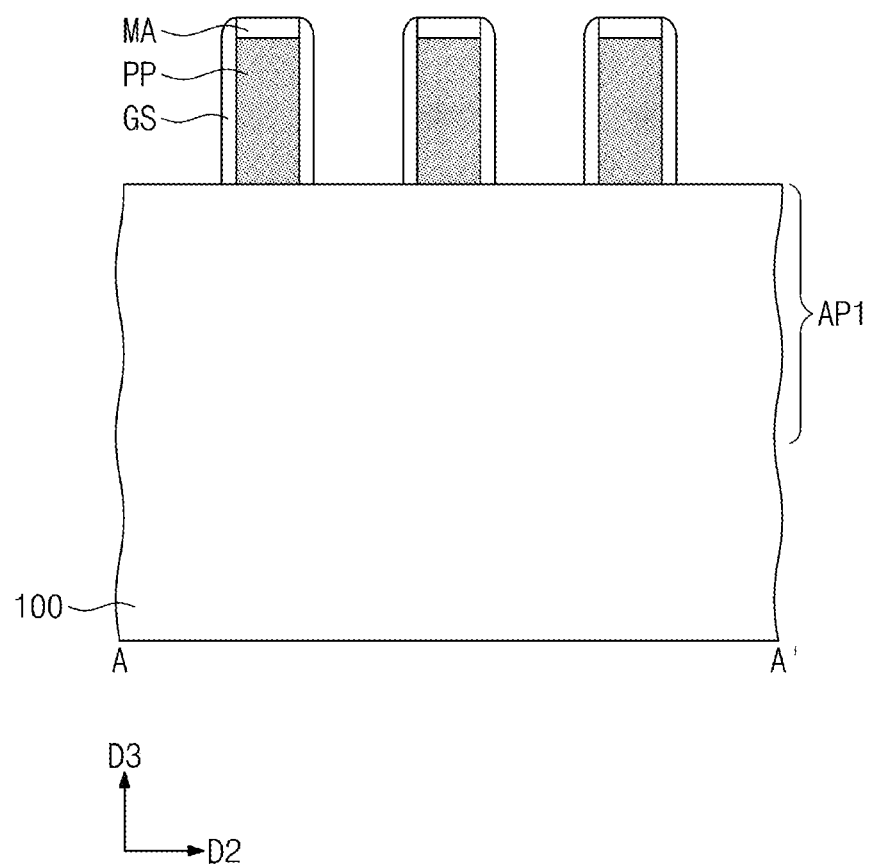
Figure 9B:
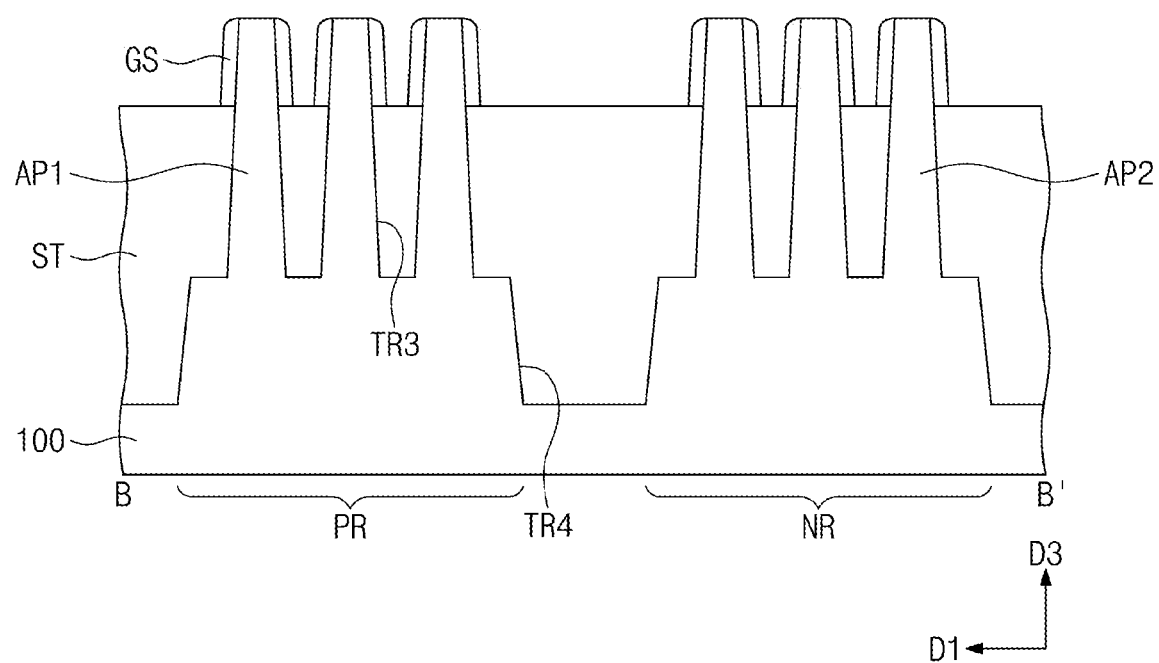
FIGS. 9B, 11B, and 13B illustrate cross-sectional views along line B-B' of FIGS. 8, 10, and 12, respectively.
Figure 9C:
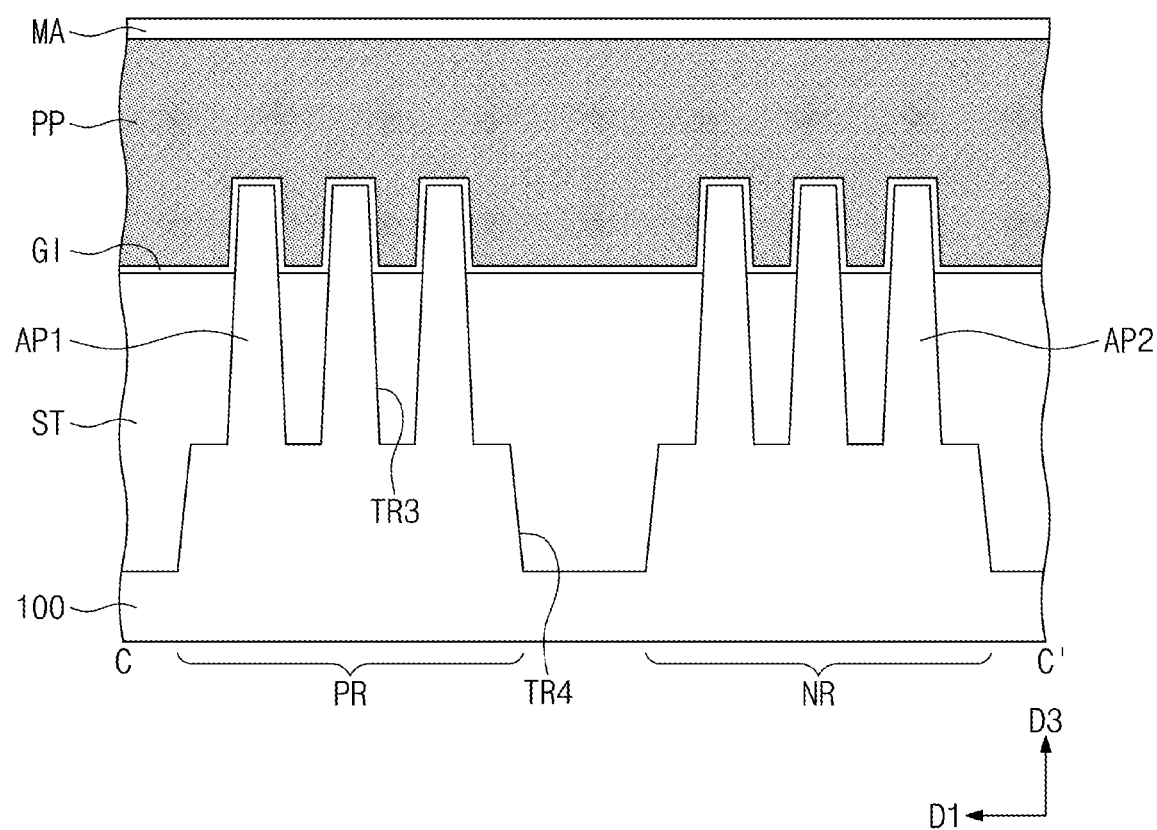
FIGS. 9C, 11C, and 13C illustrate cross-sectional views along line C-C' of FIGS. 8, 10, and 12, respectively.
Figure 10:
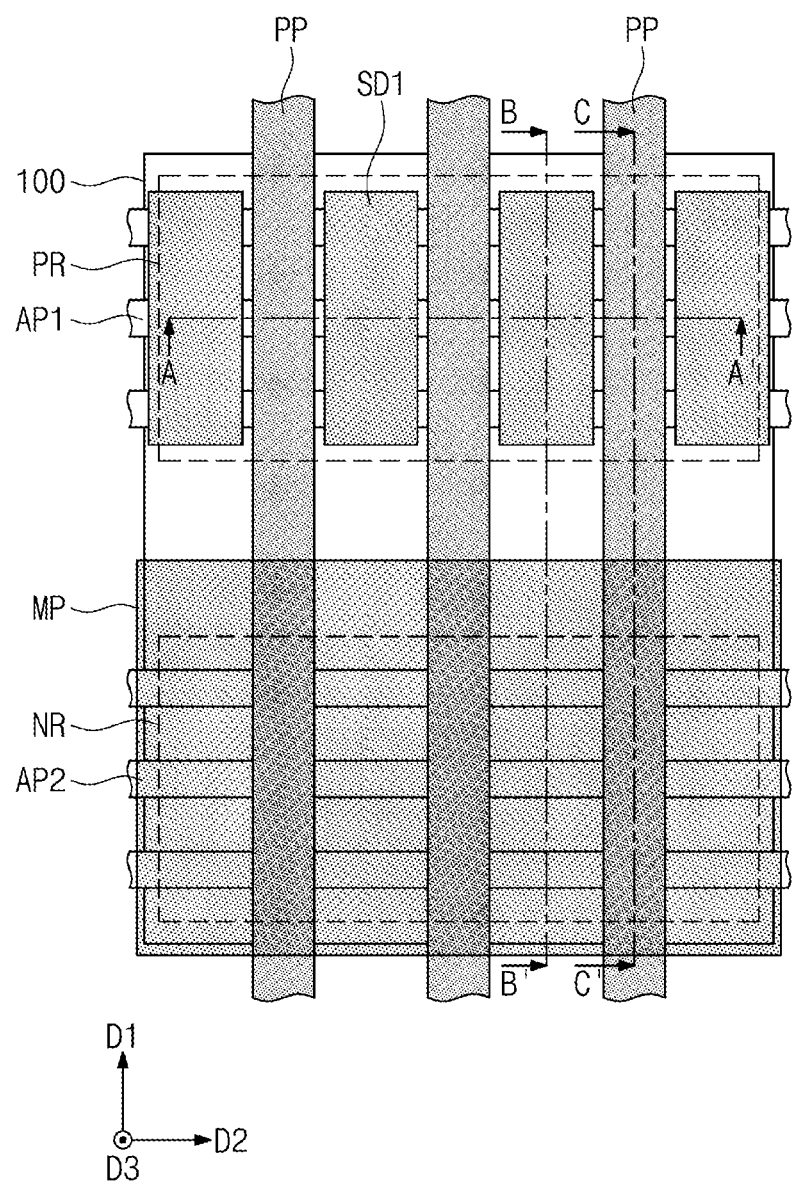
Figure 11A:
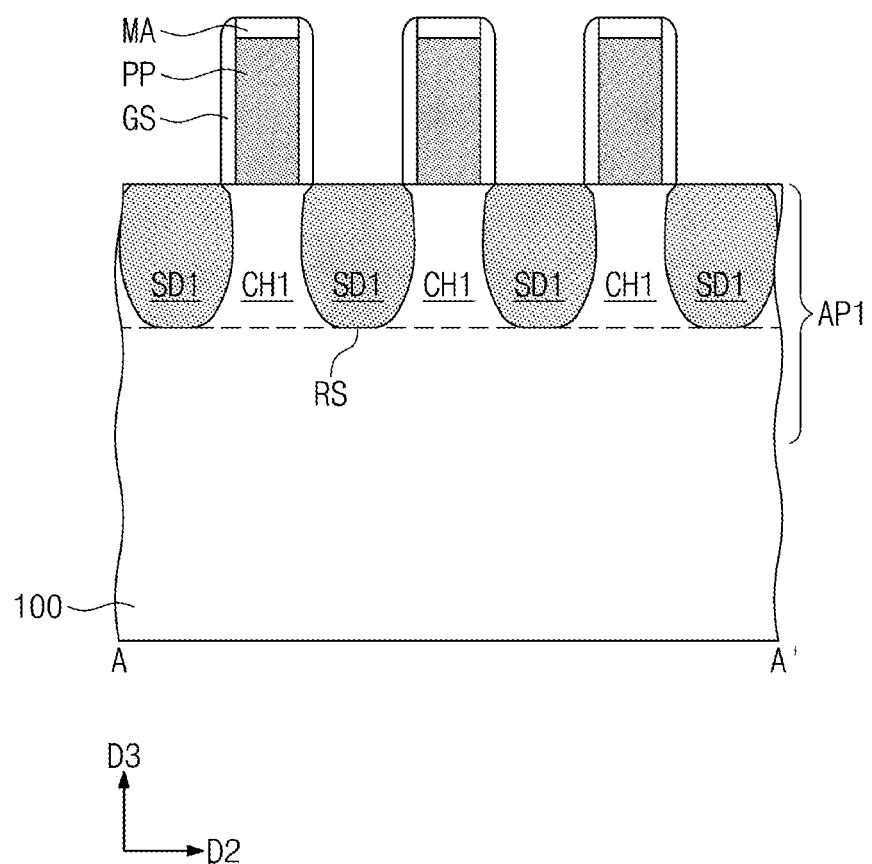
Figure 11B:
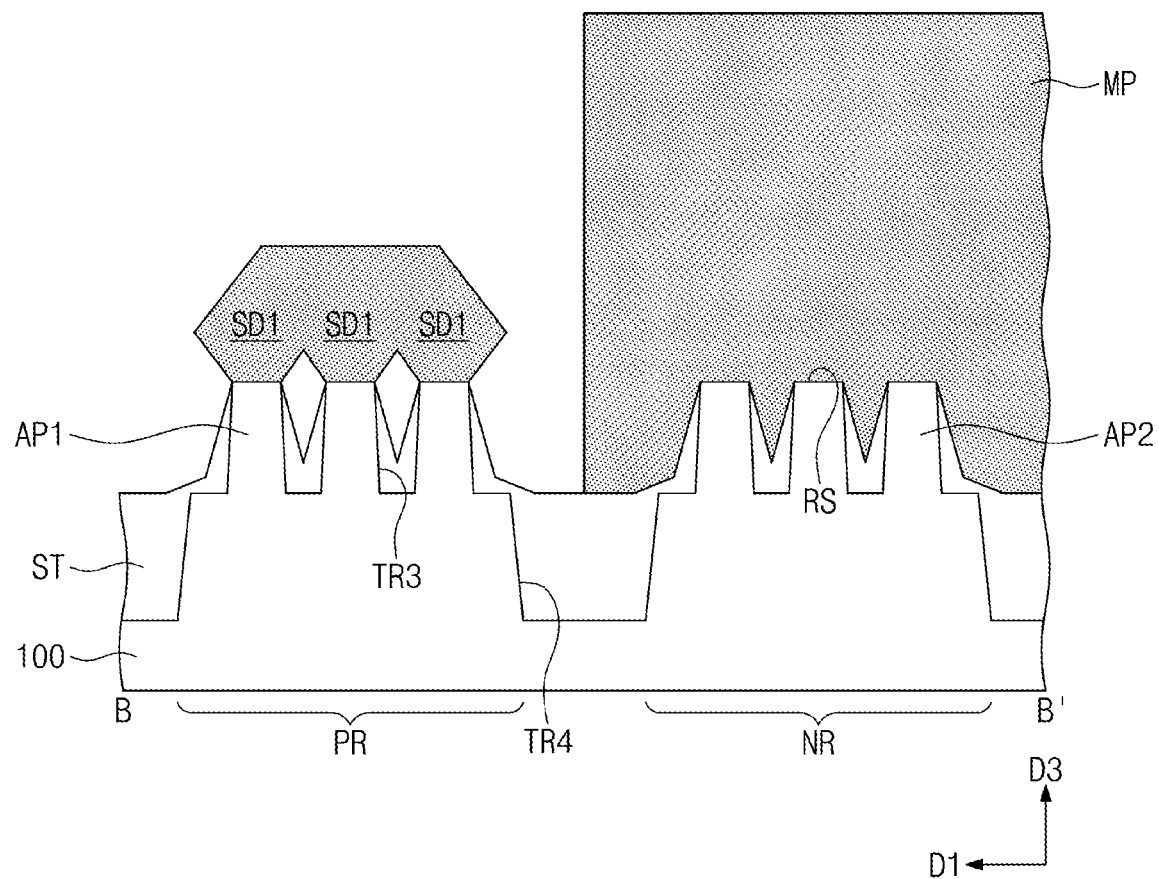
Figure 11C:
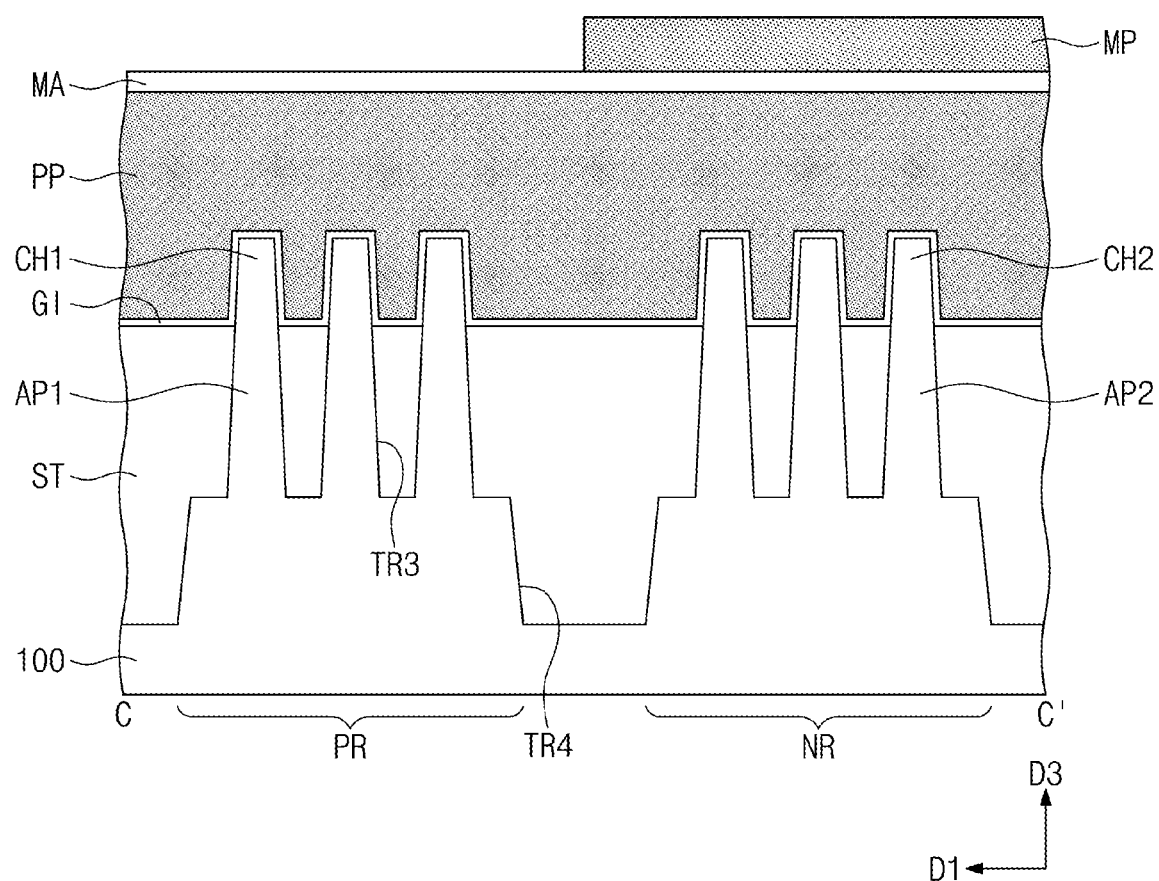
Figure 12:
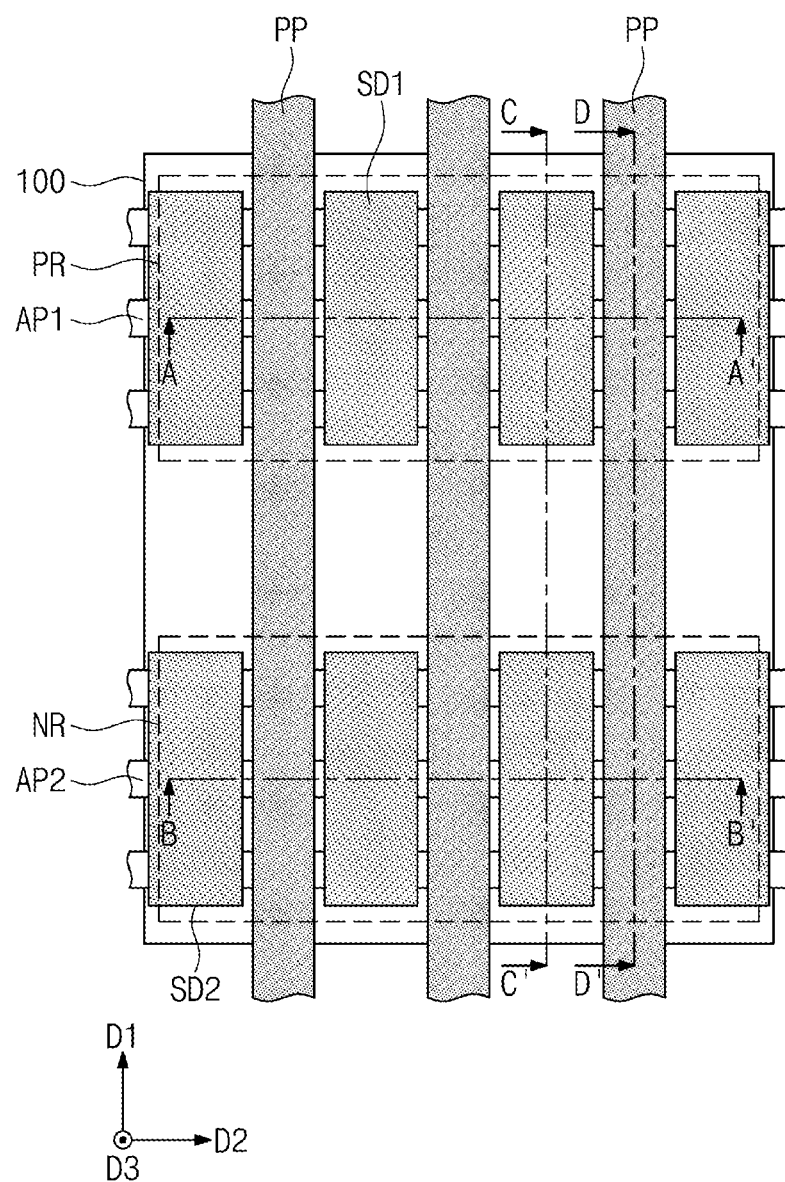
Figure 13A:
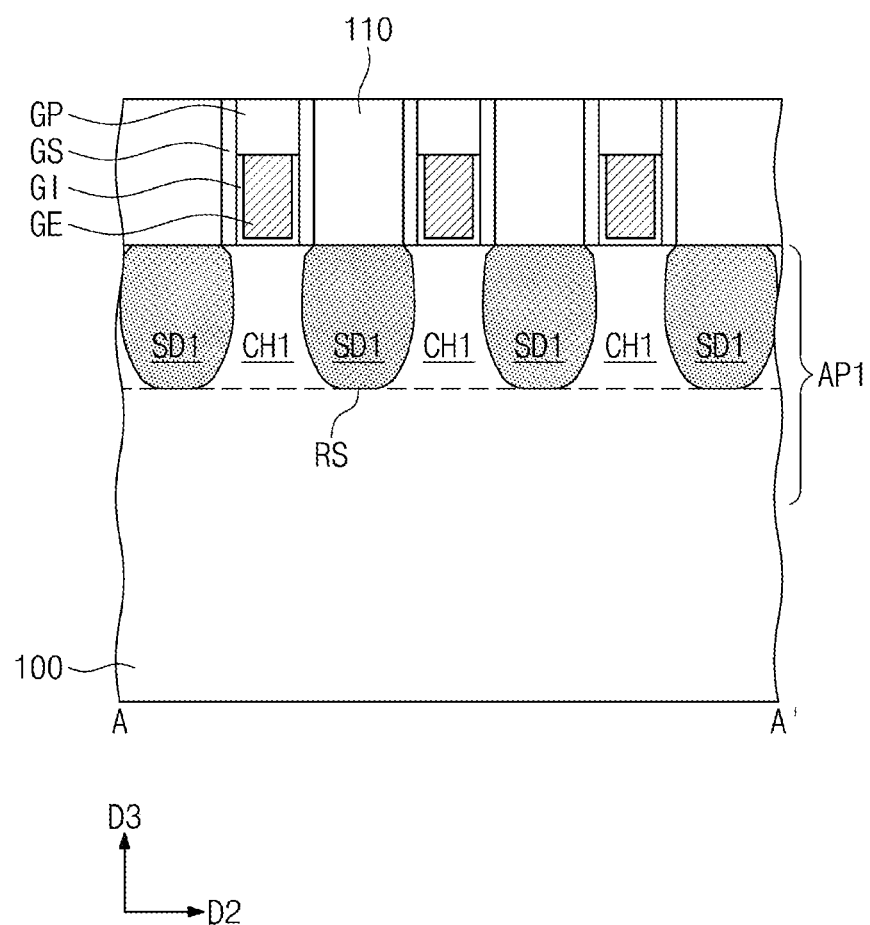
Figure 13B:
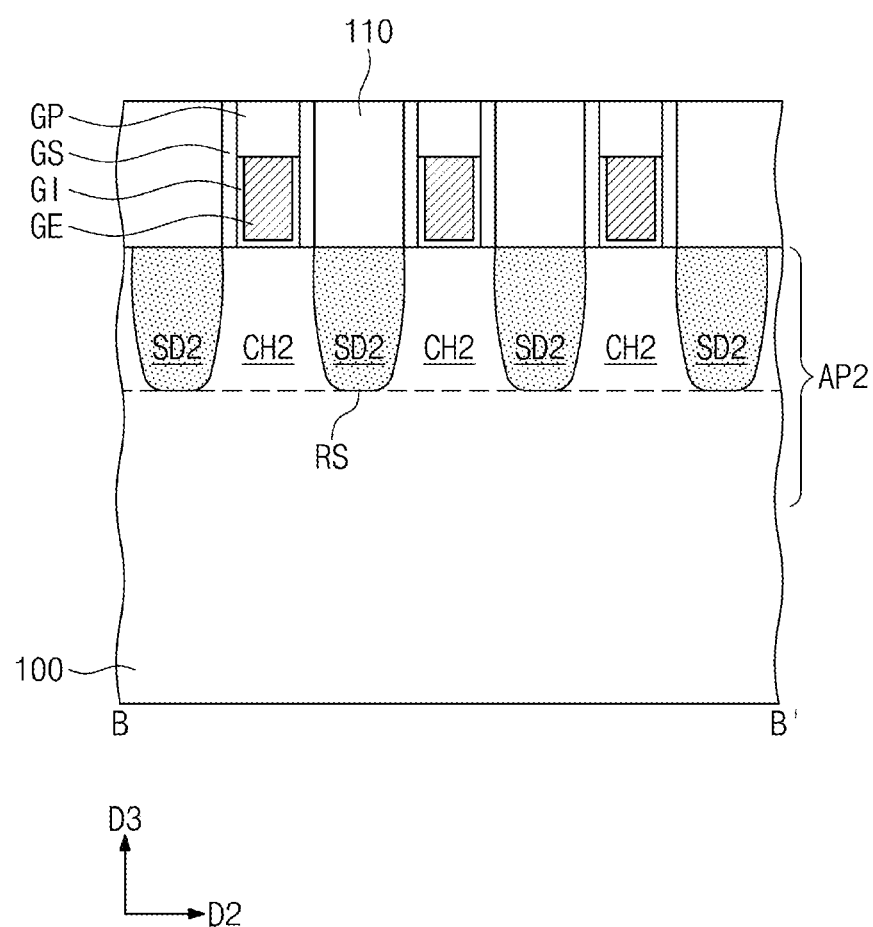
Figure 13C:
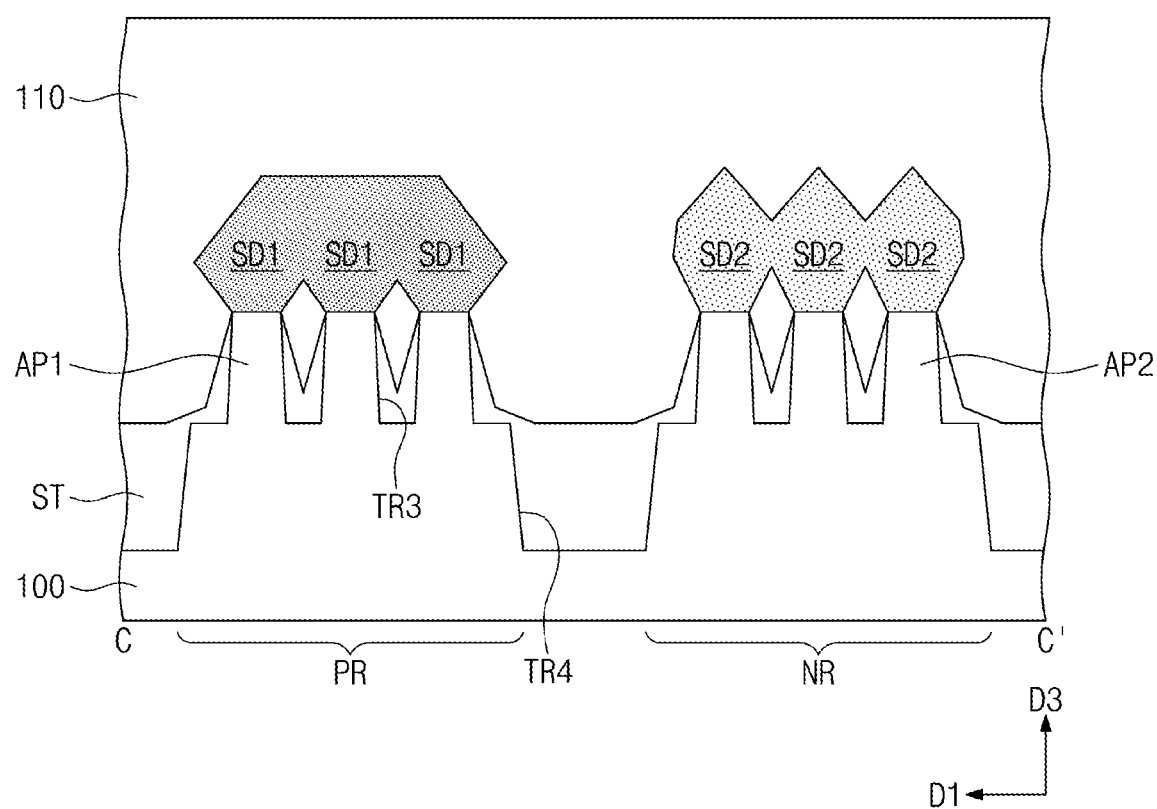
Figure 13D:
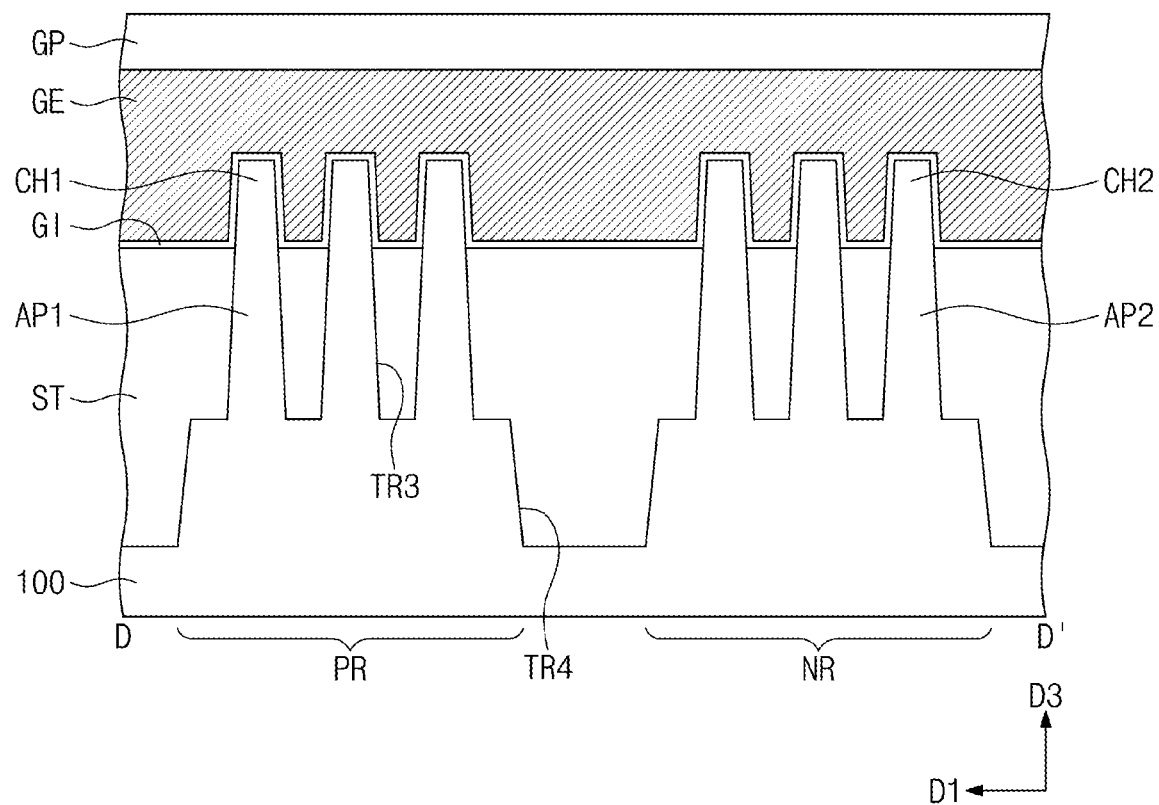
FIG. 13D illustrates a cross-sectional view along line D-D' of FIG. 12.

FIGS. 6, 8, 10, and 12 illustrate plan views showing stages in a method of fabricating a semiconductor device according to some example embodiments. FIGS. 7, 9A, 11A, and 13A illustrate cross-sectional views taken along line A-A' of FIGS. 6, 8, 10, and 12, respectively. FIGS. 9B, 11B, and 13B illustrate cross-sectional views taken along line B-B' of FIGS. 8, 10, and 12, respectively. FIGS. 9C, 11C, and 13C illustrate cross-sectional views taken along line C-C' of FIGS. 8, 10, and 12, respectively. FIG. 13D illustrates a cross-sectional view taken along line D-D' of FIG. 12.

Figure 6:
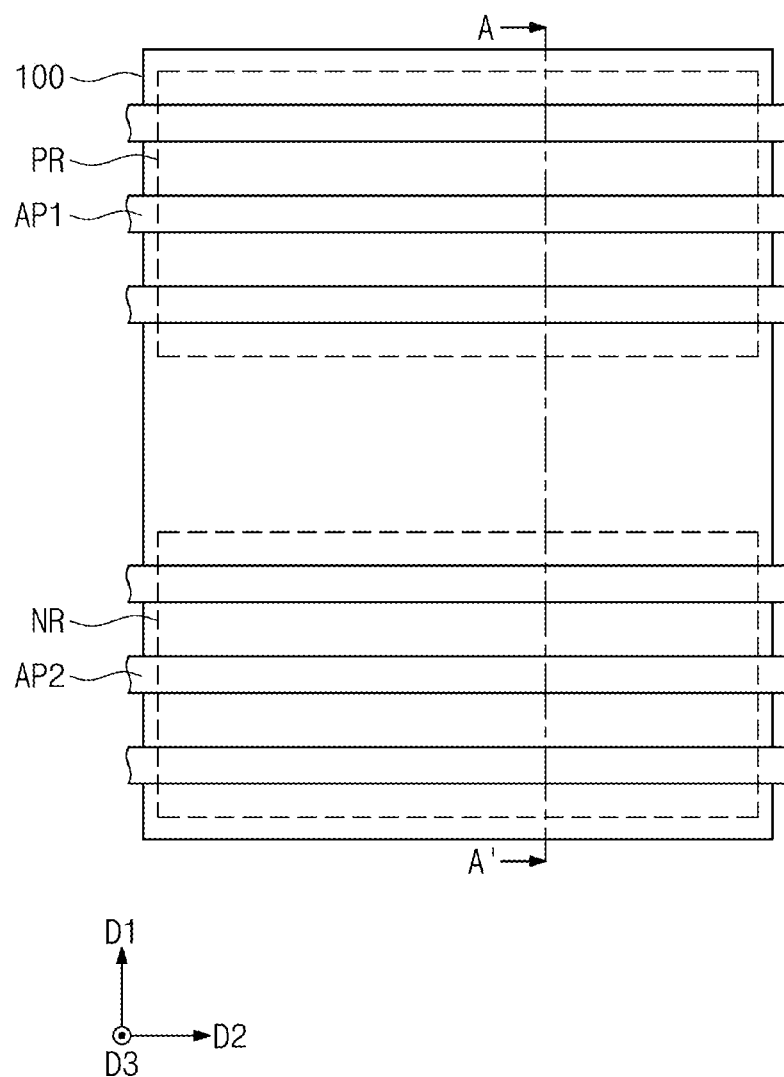
FIGS. 6, 8, 10, and 12 illustrate plan views of stages in a method of fabricating a semiconductor device according to some example embodiments.
Figure 7:
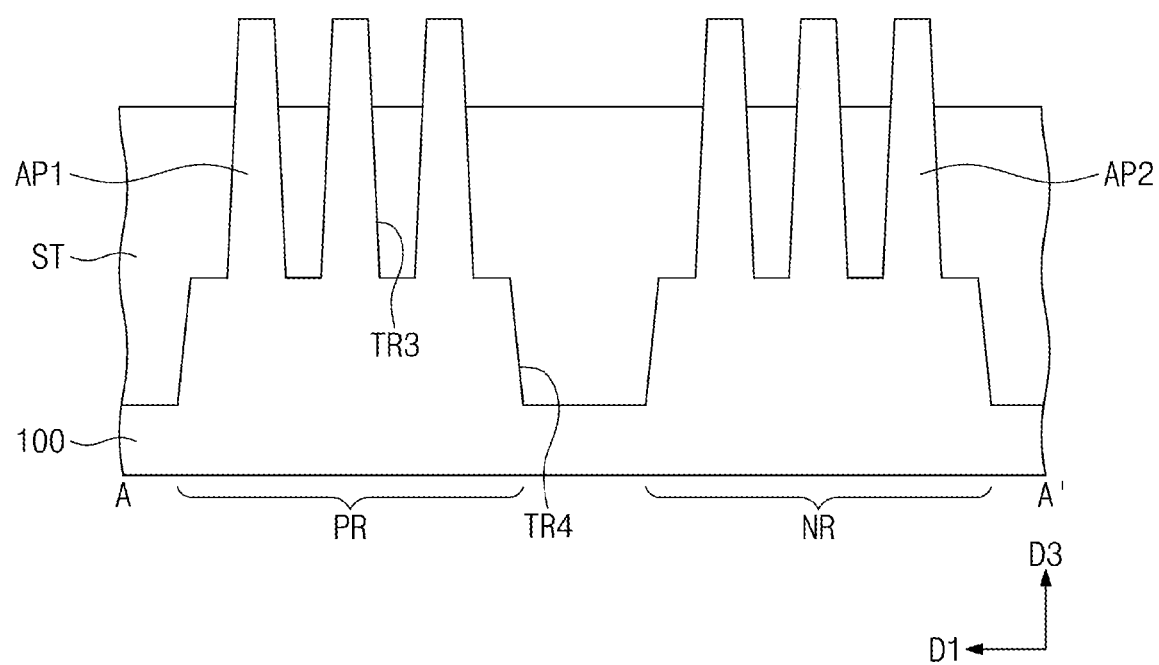
FIGS. 7, 9A, 11A, and 13A illustrate cross-sectional views along line A-A' of FIGS. 6, 8, 10, and 12, respectively.
Figure 8:
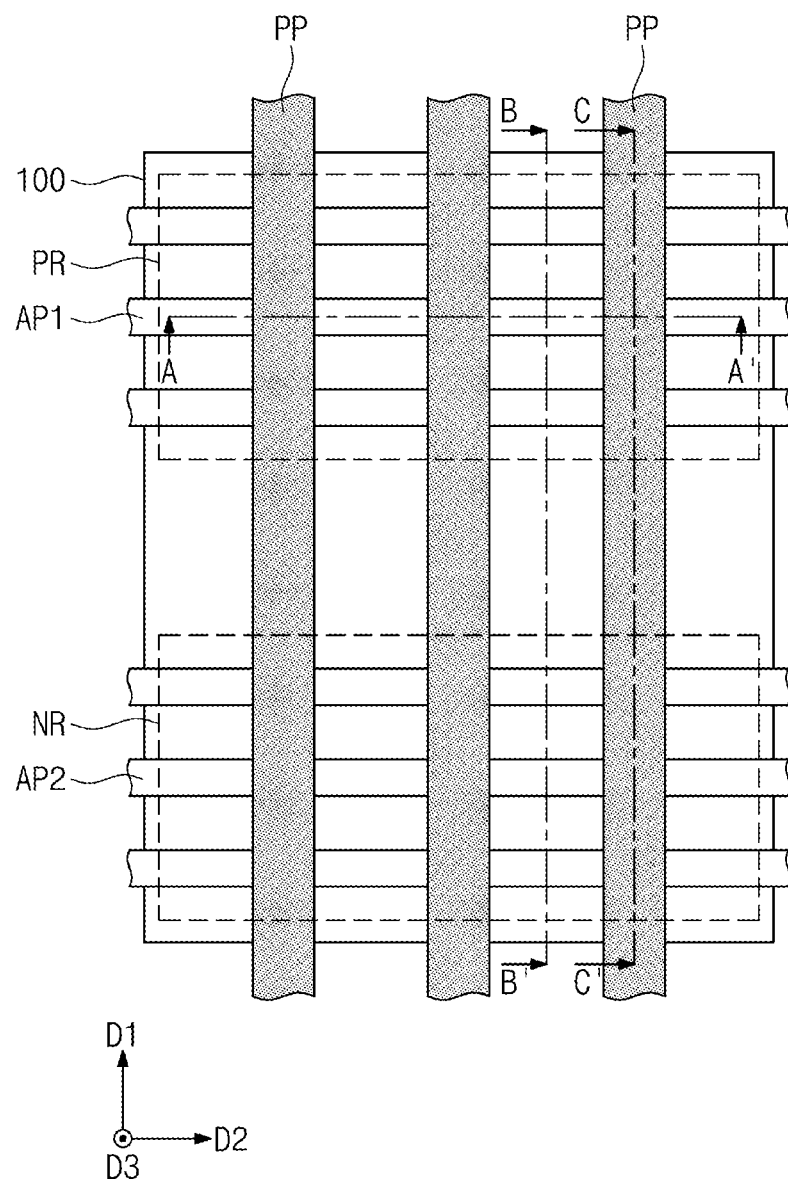

Referring to FIGS. 6 and 7, the substrate 100 may be provided with the first active region PR and the second active region NR. The substrate 100 may be patterned to form the first and second active patterns AP1 and AP2. The first active patterns AP1 may be formed on the first active region PR, and the second active patterns AP2 may be formed on the second active region NR. The third trench TR3 may be formed between the first active patterns AP1 and between the second active patterns AP2.

The substrate 100 may be patterned to form the fourth trench TR4 between the first active region PR and the second active region NR. The fourth trench TR4 may be formed deeper than the third trench TR3.

The device isolation layer ST may be formed on the substrate 100, filling the third and fourth trenches TR3 and TR4. The device isolation layer ST may include a dielectric material, e.g., a silicon oxide layer. The device isolation layer ST may be recessed until upper portions of the first and second active patterns AP1 and AP2 are exposed. Thus, the upper portions of the first and second active patterns AP1 and AP2 may protrude vertically upward from, e.g., above, the device isolation layer ST.

Referring to FIGS. 8 and 9A to 9C, sacrificial patterns PP may be formed to run across the first and second active patterns AP1 and AP2. Each of the sacrificial patterns PP may be formed to have a linear or bar shape that extends in the first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include, e.g., a polysilicon layer.

A pair of gate spacers GS may be formed on opposite sidewalls of each of the sacrificial patterns PP. The gate spacers GS may also be formed on opposite sidewalls of each of the first and second active patterns AP1 and AP2. The opposite sidewalls of each of the first and second active patterns AP1 and AP2 may be exposed portions that are covered neither with the device isolation layer ST nor with the sacrificial patterns PP.

The formation of the gate spacers GS may include conformally forming a gate spacer layer on the entire surface of the substrate 100 and anisotropically etching the gate spacer layer. For example, the gate spacer layer may include one or more of SiCN, SiCON, and SiN. In another example, the gate spacer layer may be a multi-layer including two or more of SiCN, SiCON, and SiN.

Referring to FIGS. 10 and 11A to 11C, recesses RS may be formed on the upper portion of each of the first and second active patterns AP1 and AP2. A pair of recesses RS may be formed on opposite sides of each of the sacrificial patterns PP. The formation of the recesses RS may include performing an etching process in which the hardmask patterns MA and the gate spacers GS are used as an etching mask to etch the upper portion of the first and second active patterns AP1 and AP2. When the etching process is performed, the gate spacers GS may be removed from the opposite sidewalls of each of the first and second active patterns AP1 and AP2. An exposed device isolation layer ST may be recessed during the etching process.

A first mask layer MP may be formed to selectively cover the second active patterns AP2. The first mask layer MP may selectively cover the second active region NR, but may expose the first active region PR. The first mask layer MP may expose the first active patterns AP1.

First source/drain patterns SD1 may be formed to fill the recesses RS of the first active patterns AP1 exposed by the first mask layer MP. For example, the formation of the first source/drain patterns SD1 may include performing a selective epitaxial growth process in which exposed inner sidewalls of the recesses RS are used as seed layers. The formation of the first source/drain patterns SD1 may define the first channel pattern CH1 between a pair of first source/drain patterns SD1. For example, the selective epitaxial growth process may include chemical vapor deposition (CVD) or molecular beam epitaxy (MBE).

The first source/drain pattern SD1 may include a second semiconductor element having a lattice constant that is greater than that of a first semiconductor element included in the substrate 100. For example, the first semiconductor element may be silicon (Si), and the second semiconductor element may be germanium (Ge). The first source/drain pattern SD1 may be formed to have a plurality of semiconductor layers. The formation of the first source/drain pattern SD1 may include sequentially forming semiconductor layers. For example, the semiconductor layers may constitute a buffer layer, a main layer, and a capping layer.

Referring to FIGS. 12 and 13A to 13D, the first mask layer MP may be removed. A second mask layer may be formed to selectively cover the first active patterns AP1. The second mask layer may selectively cover the first active region PR, but may expose the second active region NR. The second mask layer may expose the second active patterns AP2.

Second source/drain patterns SD2 may be formed to fill the recesses RS of the second active patterns AP2 exposed by the second mask layer. For example, the formation of the second source/drain patterns SD2 may include performing a selective epitaxial growth process in which exposed inner walls of the recesses RS are used as seed layers. The second source/drain patterns SD2 may contain the same first semiconductor element, such as silicon (Si), as that of the substrate 100. Thereafter, the second mask layer may be removed.

The first interlayer dielectric layer 110 may be formed to cover the first and second source/drain patterns SD1 and SD2, the gate spacers GS, and the hardmask patterns MA. For example, the first interlayer dielectric layer 110 may include a silicon oxide layer.

A planarization process may be performed on the first interlayer dielectric layer 110 until top surfaces of the sacrificial patterns PP are exposed. An etch-back or chemical mechanical polishing (CMP) process may be employed to planarize the first interlayer dielectric layer 110. As a result, the first interlayer dielectric layer 110 may have a top surface substantially coplanar with those of the sacrificial patterns PP and those of the gate spacers GS.

Each of the sacrificial patterns PP may be replaced with the gate electrode GE and the gate dielectric pattern GI. For example, the exposed sacrificial patterns PP may be selectively removed. The gate dielectric pattern GI may be formed in an empty space where the sacrificial pattern PP is removed. The gate electrode GE may be formed on the gate dielectric pattern GI, filling the empty space.

The gate dielectric pattern GI may be conformally formed by atomic layer deposition (ALD) and/or chemical oxidation. For example, the gate dielectric pattern GI may include a high-k dielectric material. In another example, the gate dielectric pattern GI may include a ferroelectric material.

The formation of the gate electrode GE may include forming a gate electrode layer on the gate dielectric pattern GI and planarizing the gate electrode layer. For example, the gate electrode layer may include a first gate electrode layer including metal nitride and a second gate electrode layer including low-resistance metal.

An upper portion of the gate electrode GE may be selectively etched to recess the gate electrode GE. The recessed gate electrode GE may have a top surface lower than that of the first interlayer dielectric layer 110 and those of the gate spacers GS. A gate capping pattern GP may be formed on the recessed gate electrode GE. The formation of the gate capping pattern GP may include forming a gate capping layer to cover the recessed gate electrode GE and planarizing the gate capping layer until the top surface of the first interlayer dielectric layer 110 is exposed. The gate capping layer may include, e.g., one or more of SiON, SiCN, SiCON, and SiN.

Referring back to FIGS. 4 and 5A to 5D, the second interlayer dielectric layer 120 and the third interlayer dielectric layer 130 may be formed on the first interlayer dielectric layer 110. The first connection lines M1 and the second connection lines M2 may be formed in the third interlayer dielectric layer 130. A detailed description of the formation of the first and second connection lines M1 and M2 is substantially the same as that discussed above with reference to FIGS. 1 and 2A to 2F. First and second lower vias V1_a and V1_b may be formed below the first and second connection lines M1 and M2.

FIGS. 14A, 14B, 14C, and 14D illustrate cross-sectional views respectively taken along lines A-A', B-B', C-C' and D-D' of FIG. 4, showing a semiconductor device according to some example embodiments. In the embodiment that follows, a detailed description of technical features repetitive to those discussed above with reference to FIGS. 4 and 5A to 5D will be omitted, and a difference thereof will be discussed in detail.

Referring to FIGS. 4 and 14A to 14D, the substrate 100 may be provided with the first active region PR and the second active region NR. The device isolation layer ST may be provided on the substrate 100. The device isolation layer ST may define the first active pattern AP1 and the second active pattern AP2 on an upper portion of the substrate 100. The first active pattern AP1 and the second active pattern AP2 may be respectively defined on the first active region PR and the second active region NR.

The first active pattern AP1 may include first channel patterns CH1' that are vertically stacked. The stacked first channel patterns CH1' may be spaced apart from each other in a third direction D3. The stacked first channel patterns CH1' may vertically overlap each other. The second active pattern AP2 may include second channel patterns CH2' that are vertically stacked. The stacked second channel patterns CH2' may be spaced apart from each other in the third direction D3. The stacked second channel patterns CH2' may vertically overlap each other. The first and second channel patterns CH1' and CH2' may include one or more of, e.g., silicon (Si), germanium (Ge), and silicon-germanium (SiGe).

The first active pattern AP1 may further include the first source/drain patterns SD1. The stacked first channel patterns CH1' may be interposed between a pair of neighboring first source/drain patterns SD1. The stacked first channel patterns CH1' may connect the pair of neighboring first source/drain patterns SD1 to each other.

The second active pattern AP2 may further include the second source/drain patterns SD2. The stacked second channel patterns CH2' may be interposed between a pair of neighboring second source/drain patterns SD2. The stacked second channel patterns CH2' may connect the pair of neighboring second source/drain patterns SD2 to each other.

Gate electrodes GE may be provided to extend in the first direction D1, while running across the first and second channel patterns CH1' and CH2'. The gate electrode GE may vertically overlap the first and second channel patterns CH1' and CH2'. A pair of gate spacers GS may be disposed on opposite sidewalls of the gate electrode GE. A gate capping pattern GP may be provided on the gate electrode GE.

Figure 14A:
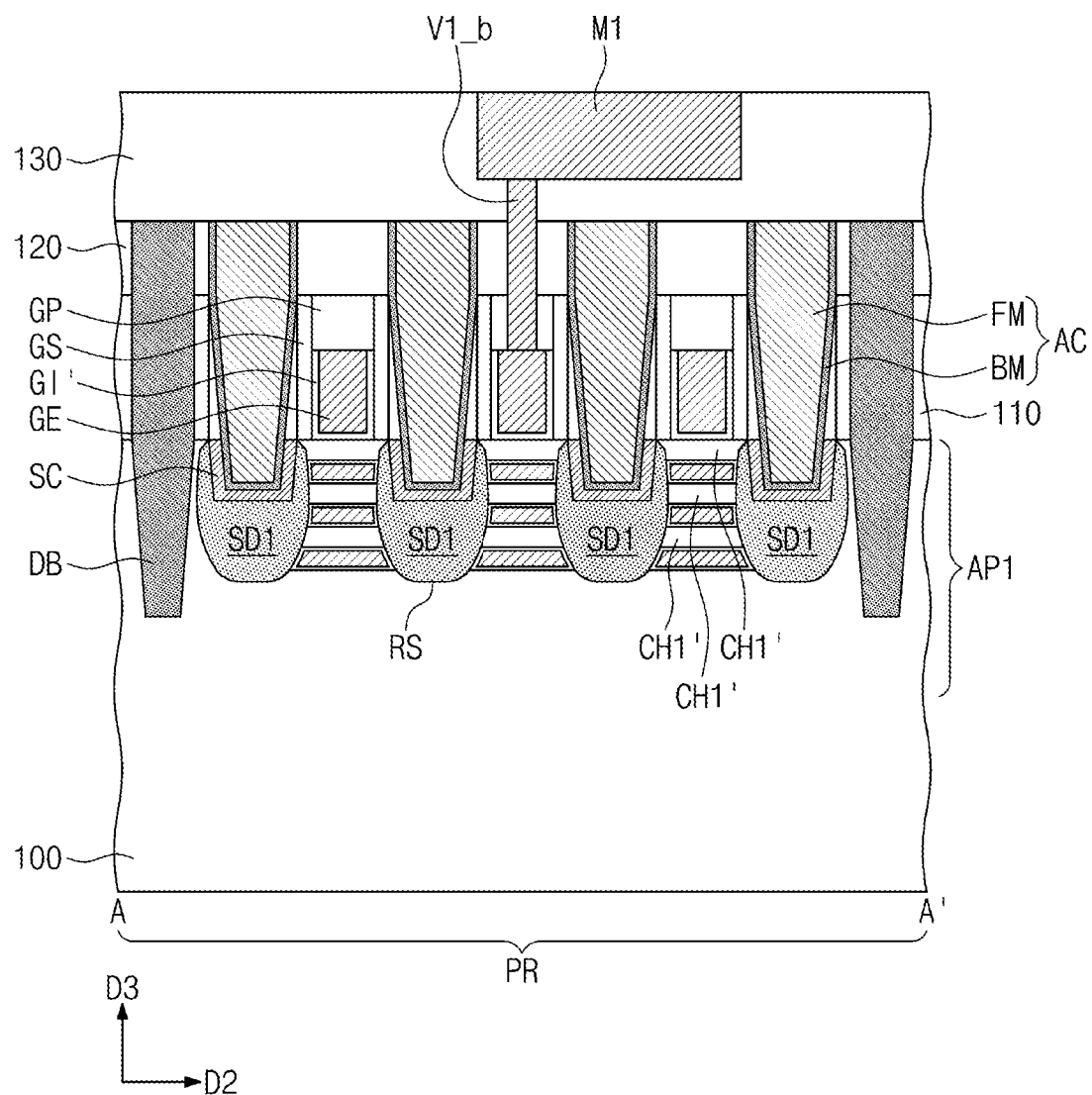
FIGS. 14A, 14B, 14C, and 14D illustrate cross-sectional views respectively taken along lines A-A', B-B', C-C', and D-D' of FIG. 4, showing a semiconductor device according to some example embodiments.
Figure 14B:
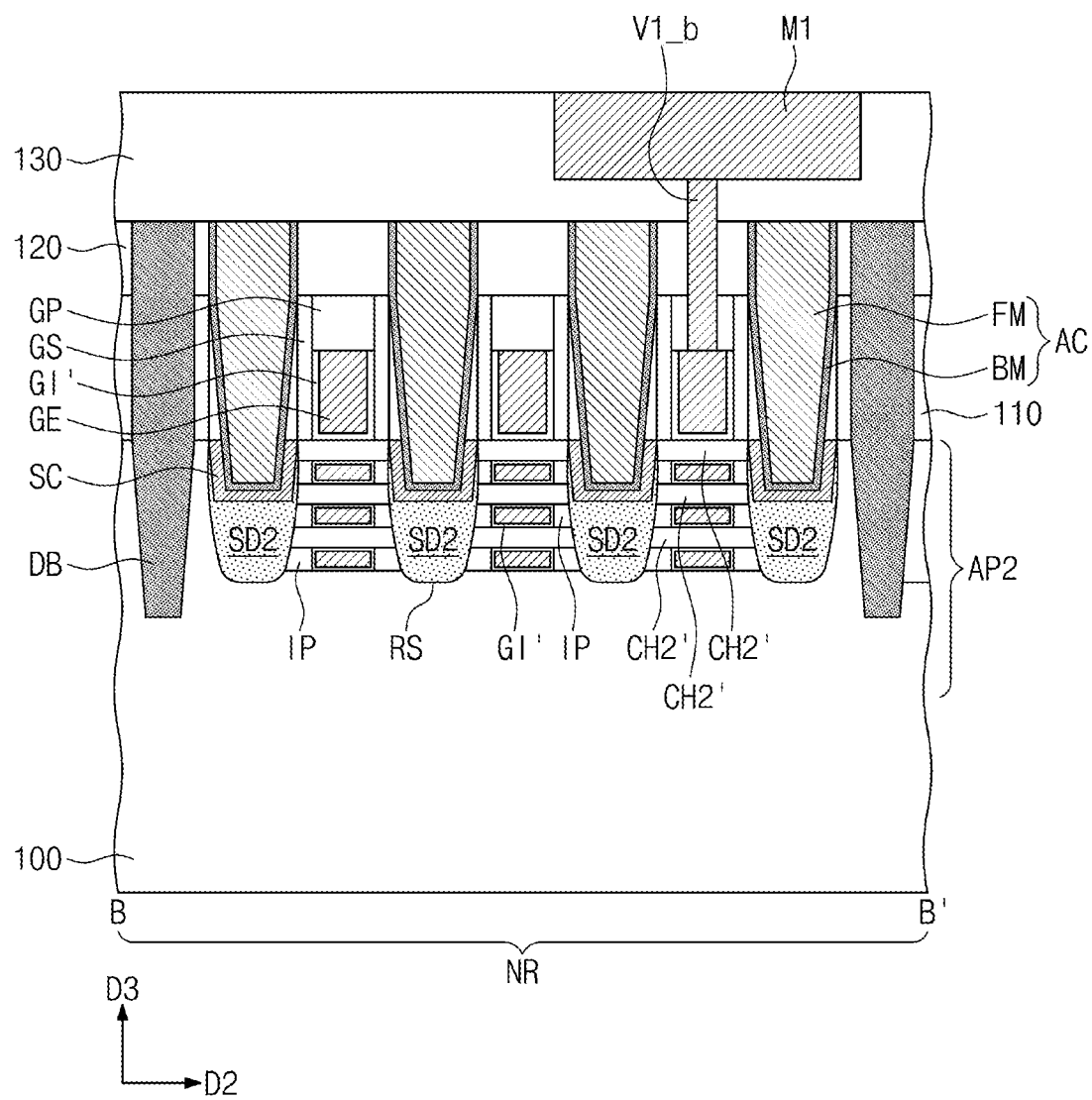
Figure 14C:
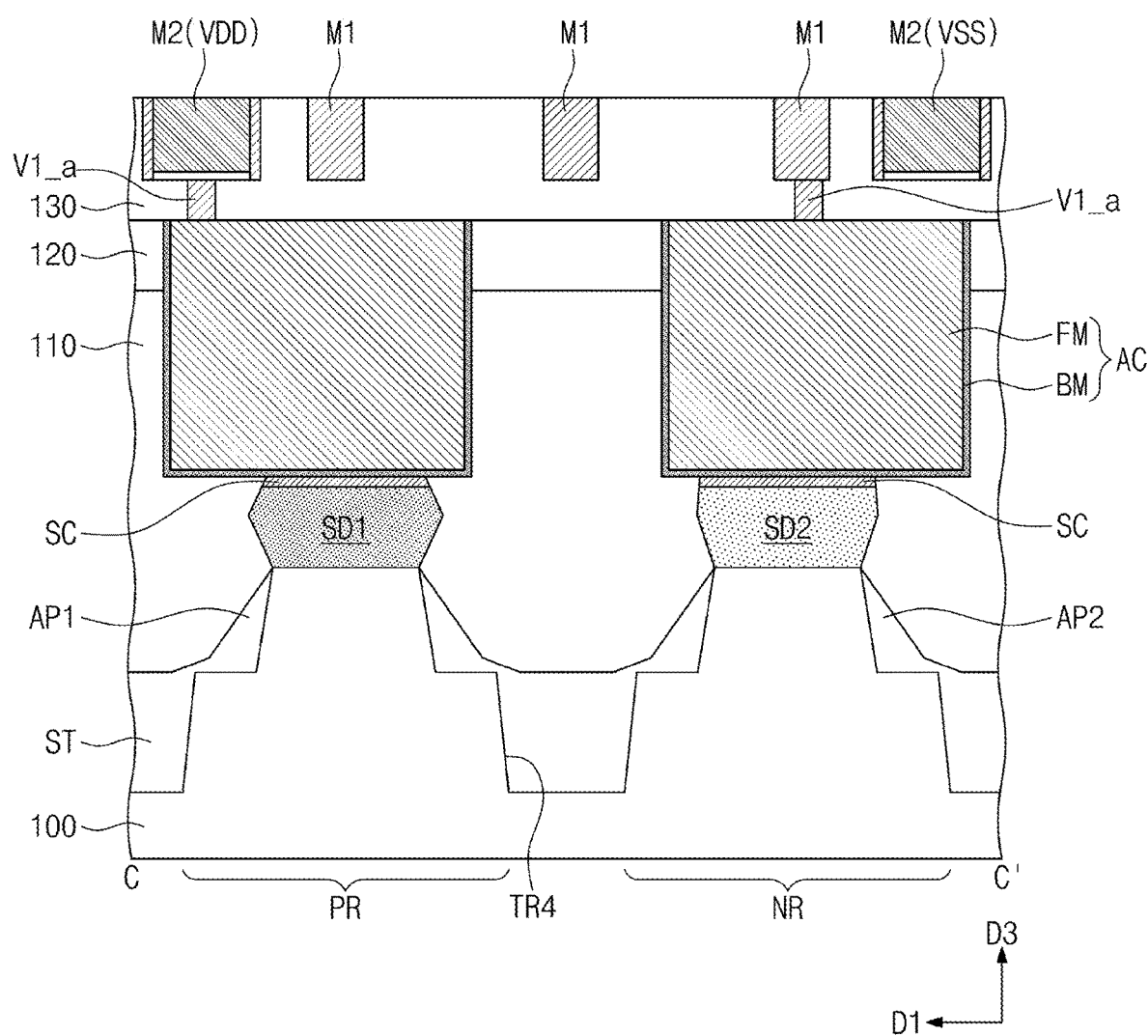
Figure 14D:
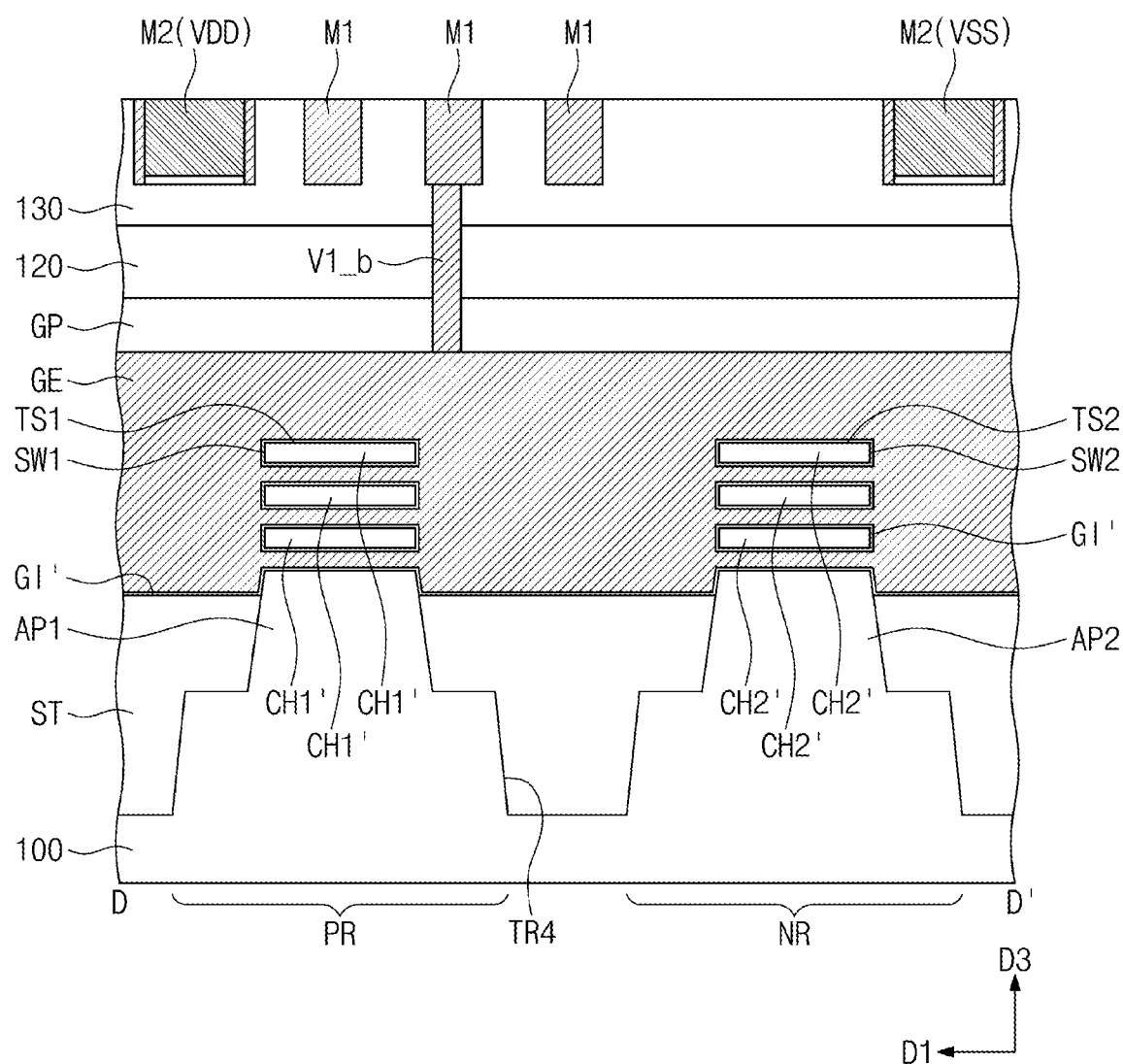

The gate electrode GE may surround each of the first and second channel patterns CH1' and CH2' (see FIG. 14D). The gate electrode GE may be provided on a first top surface TS1 of the first channel pattern CH1, at least one first sidewall SW1 of the first channel pattern CH1', and a first bottom surface BS1 of the first channel pattern CH1'. The gate electrode GE may be provided on a second top surface TS2 of the second channel pattern CH2', at least one second sidewall SW2 of the second channel pattern CH2', and a second bottom surface BS2 of the second channel pattern CH2'. For example, the gate electrode GE may surround a top surface, a bottom surface, and opposite sidewalls of each of the first and second channel patterns CH1' and CH2'. In this sense, a transistor according to the present embodiment may be a three-dimensional field effect transistor (e.g. FinFET) in which the first and second channel patterns CH1' and CH2' are three-dimensionally surrounded by the gate electrode GE.

A gate dielectric pattern GI' may be interposed between the gate electrode GE and each of the first and second channel patterns CH1' and CH2'. The gate dielectric pattern GI' may surround each of the first and second channel patterns CH1' and CH2'.

On the second active region NR, a dielectric pattern IP may be interposed between the gate dielectric pattern GI' and the second source/drain pattern SD2. The gate electrode GE may be spaced apart from the second source/drain pattern SD2 across the gate dielectric pattern GI' and the dielectric pattern IP. In contrast, no dielectric pattern IP may be provided on the first active region PR.

The first interlayer dielectric layer 110 and the second interlayer dielectric layer 120 may be provided on an entire surface of the substrate 100. The active contacts AC may be provided to penetrate the first and second interlayer dielectric layers 110 and 120 and to correspondingly have connection with the first and second source/drain patterns SD1 and SD2.

The third interlayer dielectric layer 130 may be provided on the second interlayer dielectric layer 120. The first connection lines M1 and the second connection lines M2 may be provided in the third interlayer dielectric layer 130. A detailed description of the first and second connection lines M1 and M2 is substantially the same as that discussed above with reference to FIGS. 2A to 2F.

A semiconductor device according to the present embodiments may include connection lines with metal having resistance that varies in accordance with width. As a result, it is possible to improve resistance of the semiconductor device. Further, because the semiconductor device according to the present embodiments includes a hybrid connection line, in which different metals are mixed, the semiconductor device may increase in performance. As such, the semiconductor device according to the present embodiments exhibits improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an interlayer dielectric layer on a substrate;
a first connection line that fills a first trench of the interlayer dielectric layer, the first trench having a first width; and
a second connection line that fills a second trench of the interlayer dielectric layer, the second trench having a second width greater than the first width, and the second connection line including:
a first metal layer that covers an inner sidewall of the second trench,
a barrier layer that covers a bottom surface of the second trench, and
a second metal layer on the first metal layer and the barrier layer,
wherein both the first metal layer and the barrier layer are in direct contact with the interlayer dielectric layer,
wherein the first connection line and the first metal layer include a first metal, and
wherein the second metal layer includes a second metal different from the first metal.

2. The semiconductor device as claimed in claim 1, wherein:
at the first width, a resistance of the first metal is less than a resistance of the second metal, and
at the second width, the resistance of the second metal is less than the resistance of the first metal.

3. The semiconductor device as claimed in claim 1, wherein:
the first metal includes at least one of cobalt (Co), ruthenium (Ru), rhodium (Rh), iridium (Ir), and molybdenum (Mo), and
the second metal includes at least one of copper (Cu), ruthenium (Ru), molybdenum (Mo), platinum (Pt), iridium (Ir), rhodium (Rh), and titanium nitride (TiN).

4. The semiconductor device as claimed in claim 1, wherein the first metal includes ruthenium (Ru), and the second metal includes copper (Cu).

5. The semiconductor device as claimed in claim 1, wherein an aspect ratio of the first connection line is 1.5 to 3.5.

6. The semiconductor device as claimed in claim 1, wherein an aspect ratio of the second connection line is 0.5 to 1.5.

7. The semiconductor device as claimed in claim 1, wherein the barrier layer includes at least one of hafnium nitride (HfN), tungsten nitride (WN), tungsten carbonitride (WCN), hafnium oxide (HfO), and tungsten oxide (WO).

8. A semiconductor device, comprising:
a substrate including a first active region;
a first active pattern on the first active region;
a first source/drain pattern on an upper portion of the first active pattern;
at least one gate electrode across the first active pattern;
an interlayer dielectric layer covering the first source/drain pattern and the at least one gate electrode;
a first connection line in the interlayer dielectric layer, the first connection line having a first width; and
a second connection line in the interlayer dielectric layer, the second connection line having a second width greater than the first width, and the second connection line including:
a first metal layer on an inner sidewall of a trench of the interlayer dielectric layer,
a barrier layer on a bottom surface of the trench of the interlayer dielectric layer, and
a second metal layer directly on the first metal layer and the barrier layer,
wherein the first connection line and the first metal layer include a first metal, and the second metal layer includes a second metal different from the first metal, and
wherein the barrier layer is spaced apart from the inner sidewall of the trench.

9. The semiconductor device as claimed in claim 8, wherein the substrate further includes:
a second active region;
a second active pattern on the second active region; and
a second source/drain pattern on an upper portion of the second active pattern.

10. The semiconductor device as claimed in claim 9, wherein:
the first active pattern includes first channel patterns that are vertically stacked,
the second active pattern includes second channel patterns that are vertically stacked,
the at least one gate electrode includes a plurality of gate electrodes,
a first gate electrode of the plurality of gate electrodes is on a top surface, a bottom surface, and opposite sidewalls of each of the first channel patterns, and
a second gate electrode of the plurality of gate electrodes is on a top surface, a bottom surface, and opposite sidewalls of each of the second channel patterns.

11. The semiconductor device as claimed in claim 8, wherein:
at the first width, a resistance of the first metal is less than a resistance of the second metal, and
at the second width, the resistance of the second metal is less than the resistance of the first metal.

12. The semiconductor device as claimed in claim 8, wherein the first metal layer is in contact with the second metal layer.

13. The semiconductor device as claimed in claim 8, wherein the first metal layer is in contact with only a part of the bottom surface of the trench.

14. The semiconductor device as claimed in claim 8, wherein the barrier layer includes at least one of hafnium nitride (HfN), tungsten nitride (WN), tungsten carbonitride (WCN), hafnium oxide (HfO), and tungsten oxide (WO).

15. A semiconductor device, comprising:
a substrate including a first active region;
a first active pattern on the first active region;
a gate electrode across the first active pattern;
an interlayer dielectric layer covering the gate electrode;
a first connection line that fills a first trench of the interlayer dielectric layer, the first trench having a first width; and
a second connection line that fills a second trench of the interlayer dielectric layer, the second trench having a second width greater than the first width, and the second connection line including:

a first metal layer on an inner sidewall of the second trench of the interlayer dielectric layer, a barrier layer on a bottom surface of the second trench of the interlayer dielectric layer, and a second metal layer on the first metal layer and the barrier layer, wherein the first metal layer contacts only a part of the bottom surface of the second trench, wherein the first connection line and the first metal layer include a first metal, and the second metal layer includes a second metal different from the first metal, and wherein the first metal layer is in contact with the second metal layer.

16. The semiconductor device as claimed in claim 15, wherein an aspect ratio of the first connection line is 1.5 to 3.5, and an aspect ratio of the second connection line is 0.5 to 1.5.

17. The semiconductor device as claimed in claim 15, wherein the barrier layer includes at least one of hafnium nitride (HfN), tungsten nitride (WN), tungsten carbonitride (WCN), hafnium oxide (HfO), and tungsten oxide (WO).

18. The semiconductor device as claimed in claim 15, wherein the barrier layer is spaced apart from the inner sidewall of the second trench.

19. The semiconductor device as claimed in claim 15, wherein the first metal layer of the second connection line is conformal only on the inner sidewall of the second trench among all inner surfaces of the second trench.

\* \* \* \* \*